US012733433B2

(12) United States Patent
Hotta et al.

(10) Patent No.: US 12,733,433 B2
(45) Date of Patent: Sep. 8, 2026

(54) SEMICONDUCTOR APPARATUS, TEMPERATURE COMPENSATION SYSTEM, AND ALARM SYSTEM

(71) Applicant: Sony Semiconductor Solutions Corporation, Kanagawa (JP)

(72) Inventors: Kaihei Hotta, Kanagawa (JP); Kyoichi Takenaka, Kanagawa (JP); Naoki Kawazu, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 527 days.

(21) Appl. No.: 17/916,894

(22) PCT Filed: Apr. 15, 2021

(86) PCT No.: PCT/JP2021/015579
§ 371 (c)(1),
(2) Date: Oct. 4, 2022

(87) PCT Pub. No.: WO2021/229995
PCT Pub. Date: Nov. 18, 2021

(65) Prior Publication Data
US 2023/0163000 A1 May 25, 2023

(30) Foreign Application Priority Data
May 14, 2020 (JP) ................................ 2020-085503

(51) Int. Cl.
*H10P 72/00* (2026.01)
*G01K 7/01* (2006.01)
*G01K 7/16* (2006.01)

(52) U.S. Cl.
CPC .......... *H10P 72/0602* (2026.01); *G01K 7/015* (2013.01); *G01K 7/16* (2013.01)

(58) Field of Classification Search
CPC .......... H01L 21/67248; H01L 25/0657; H01L 2225/06527; H01L 2225/06541;
(Continued)

(56) References Cited

U.S. PATENT DOCUMENTS 6,890,097 B2 * 5/2005 Tanaka .................... G01K 7/01 374/185
2004/0071189 A1 4/2004 Tanaka
(Continued)

FOREIGN PATENT DOCUMENTS

CN 103617966 A 3/2014
JP H05235253 A 9/1993
(Continued)

OTHER PUBLICATIONS

International Search Report (PCT/ISA/210), International Application No. PCT/JP2021/015579, dated Jul. 6, 2021.
Chinese Office Action issued May 29, 2026 for corresponding Chinese Application No. 202180027270.X.

*Primary Examiner* — Kristina M Deherrera
*Assistant Examiner* — Evan Mancini
(74) *Attorney, Agent, or Firm* — Michael Best & Friedrich LLP

(57) ABSTRACT

An object of the present invention is to provide a semiconductor apparatus capable of recognizing the actual temperature for each semiconductor chip even while driving the device.
A semiconductor apparatus of the present disclosure includes a semiconductor chip, a plurality of pad electrodes formed in the semiconductor chip, and an impedance element electrically connected between at least two pad electrodes of the plurality of pad electrodes. Then, the semiconductor apparatus is configured to be capable of measuring a temperature of the semiconductor chip by applying a certain
(Continued)

electrical signal between the at least two pad electrodes connected with the impedance element from outside of the semiconductor chip.

16 Claims, 19 Drawing Sheets

(58) Field of Classification Search
CPC ....... H01L 23/34; H01L 23/482; H01L 23/58; G01K 7/015; G01K 7/16; G01K 1/20; G01K 7/18; H10F 39/809; H10F 39/12; G01L 7/18; H04N 25/70; H10D 48/021
USPC .......................................................... 374/178
See application file for complete search history.

(56) References Cited

U.S. PATENT DOCUMENTS

| | | | | |
|---|---|---|---|---|
| 2007/0145986 | A1 | 6/2007 | Alie | |
| 2017/0111037 | A1 | 4/2017 | Hoshi et al. | |
| 2018/0045664 | A1* | 2/2018 | Ahn | G01N 27/128 |
| 2019/0057918 | A1* | 2/2019 | Park | H10F 39/802 |

FOREIGN PATENT DOCUMENTS

| | | | |
|---|---|---|---|
| JP | 2000261137 | A | 9/2000 |
| JP | 2011086742 | A | 4/2011 |
| JP | 2014236110 | A | 12/2014 |
| JP | 2015002229 | A | 1/2015 |
| JP | 2019134318 | A | 8/2019 |

* cited by examiner

SEMICONDUCTOR APPARATUS, TEMPERATURE COMPENSATION SYSTEM, AND ALARM SYSTEM

TECHNICAL FIELD

The present disclosure relates to a semiconductor apparatus, a temperature compensation system, and an alarm system.

BACKGROUND ART

Some semiconductor apparatuses have a temperature sensor equipped inside a device to measure the internal temperature of the device. In this type of semiconductor apparatus, manufacturing variation and the like sometimes causes fluctuations in the temperature measurements by the temperature sensor. Such a fluctuation in individual devices is corrected by bringing a pad electrode in contact with a thermocouple to measure the device's temperature and using the obtained measurement results to compensate for the temperature measured by the temperature sensor (e.g., see Patent Document 1).

CITATION LIST

Patent Document

Patent Document 1: Japanese Patent Application Laid-Open No. 2019-134318

SUMMARY OF THE INVENTION

Problems to be Solved by the Invention

The temperature compensation mentioned above has a challenge caused by fluctuations in the in-plane temperatures of a wafer. The temperature measurement and compensation in the temperature sensor are thus required to be performed for each semiconductor chip. The traditional technique disclosed in Patent Document 1 measures the in-plane temperature of the wafer by bringing the pad electrode in contact with the thermocouple. This traditional technique, however, fails to recognize the actual temperature for each semiconductor chip while driving the device.

Thus, the present disclosure is intended to provide a semiconductor apparatus capable of recognizing the actual temperature for each semiconductor chip even while driving the device, a temperature compensation system of the semiconductor apparatus, and an alarm system using the temperature compensation system.

Solutions to Problems

A semiconductor apparatus of the present disclosure for achieving the above object includes:

a semiconductor chip;

a plurality of pad electrodes formed in the semiconductor chip; and an impedance element electrically connected between at least two pad electrodes of the plurality of pad electrodes. Then, the semiconductor apparatus is configured to be capable of measuring a temperature of the semiconductor chip by applying a certain electrical signal between the at least two pad electrodes connected with the impedance element from outside of the semiconductor chip.

Furthermore, a temperature compensation system of the present disclosure for achieving the above object includes:

a semiconductor apparatus having a semiconductor chip equipped with a temperature sensor;

a temperature measuring unit that measures a temperature of the semiconductor chip; and a temperature compensation unit that compensates for a temperature sensed by the temperature sensor. Then, the semiconductor apparatus has a plurality of pad electrodes formed in the semiconductor chip and an impedance element electrically connected between at least two pad electrodes among the plurality of pad electrodes, the temperature measuring unit measures the temperature of the semiconductor chip by applying a certain electrical signal between the at least two pad electrodes connected with the impedance element from outside of the semiconductor chip, and the temperature compensation unit compensates for the temperature sensed by the temperature sensor on the basis of the temperature of the semiconductor chip measured by the temperature measuring unit.

In addition, an alarm system of the present disclosure for achieving the above object includes:

a semiconductor apparatus having a semiconductor chip equipped with a temperature sensor;

a temperature measuring unit that measures a temperature of the semiconductor chip;

a temperature compensation unit that compensates for a temperature sensed by the temperature sensor; and an alarm unit. Then, the semiconductor apparatus has a plurality of pad electrodes formed in the semiconductor chip and an impedance element electrically connected between at least two pad electrodes among the plurality of pad electrodes, the temperature measuring unit measures the temperature of the semiconductor chip by applying a certain electrical signal between the at least two pad electrodes connected with the impedance element from outside of the semiconductor chip, the temperature compensation unit compensates for the temperature sensed by the temperature sensor on the basis of the temperature of the semiconductor chip measured by the temperature measuring unit, and the alarm unit issues an alarm upon detecting that the temperature compensated for by the temperature compensation unit exceeds a predetermined reference temperature.

MODE FOR CARRYING OUT THE INVENTION

Figure 1:
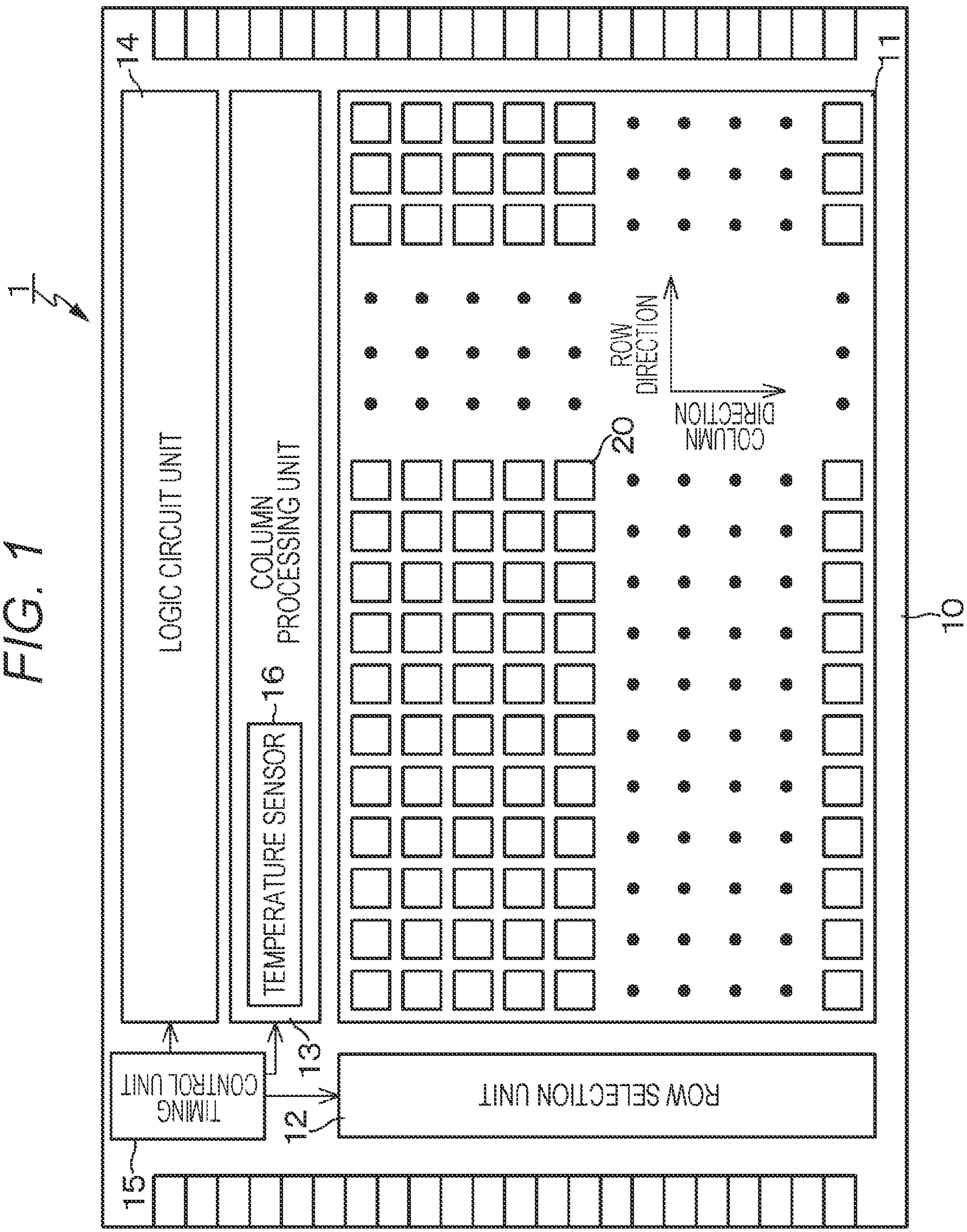
FIG. 1 is a system configuration diagram illustrating an overview of a basic configuration of a CMOS image sensor that is an example of a semiconductor apparatus of the present disclosure.

Hereinbelow, modes for implementing the technology according to the present disclosure (hereinafter, referred to as "embodiments") are described in detail using the drawings. The technology according to the present disclosure is not limited to the embodiments, and various numerical values and the like in the embodiments are examples. In the following description, the same reference numerals are used for the same elements or elements having the same functions, and a repeated description is omitted. Note that the description is given in the following order.

1. Overall description of semiconductor apparatus, temperature compensation system, and alarm system according to present disclosure
2. Semiconductor apparatus having applied technology according to present disclosure (exemplary image capturing apparatus)
   - 2-1. Configuration example of CMOS image sensor
   - 2-2. Configuration example of pixel
   - 2-3. Structure of chip
   - 2-4. Measurement of in-plane temperature of wafer using thermocouple
3. First embodiment (exemplary semiconductor apparatus)
   - 3-1. Example 1 (exemplary temperature measurement by application of certain voltage to resistance element)
   - 3-2. Example 2 (exemplary temperature measurement by flowing of certain current through resistance element)
   - 3-3. Example 3 (modification of Example 1: example of reference resistance element provided in measurement system)
   - 3-4. Example 4 (exemplary arrangement structure of pad electrode connected with resistance element)
   - 3-5. Example 5 (modification of Example 4: example of making two pad electrodes connected with resistance element larger in size than another pad electrode)
   - 3-6. Example 6 (modification of Example 4: example of making two pad electrodes connected with resistance element smaller in size than another pad electrode)
   - 3-7. Example 7 (modification of Example 4: example of sandwiching another pad electrode between two pad electrodes connected with resistance element)
   - 3-8. Example 8 (modification of Example 4: example in which each of two pad electrodes connected with resistance element includes multiple pad electrodes)
   - 3-9. Example 9 (modification of Example 8: example of three pad electrodes connected with resistance element)
   - 3-10. Example 10 (application example of two pad electrodes)
   - 3-11. Modification of first embodiment
   - 3-12. Structure of stacked structure semiconductor chip
4. Second embodiment (exemplary temperature compensation system)
5. Third embodiment (exemplary alarm system)
6. Application example having applied technology according to present disclosure (example of application to mobile body)
7. Possible configurations of present disclosure <Overall Description of Semiconductor Apparatus, Temperature Compensation System, and Alarm System According to Present Disclosure>

In a semiconductor apparatus, a temperature compensation system, and an alarm system according to present disclosure, an impedance element can be configured as a temperature-dependent element, preferably, a resistance element.

Furthermore, in the semiconductor apparatus of the present disclosure including the above-described preferable configuration, the semiconductor chip may be equipped with a temperature sensor configured to measure a temperature inside a device.

In the semiconductor apparatus of the present disclosure including the above-described preferable configuration, the at least two pad electrodes connected with the impedance element may be larger in size than another pad electrode.

Alternatively, the at least two pad electrodes connected with the impedance element may be smaller in size than another pad electrode.

Furthermore, in the semiconductor apparatus of the present disclosure including the above-described preferable configuration, the at least two pad electrodes connected with the impedance element may be provided such that another pad electrode is sandwiched between the at least two pad electrodes. Alternatively, the at least two pad electrodes connected with the impedance element each may include multiple pad electrodes that are adjacent and electrically connected to each other.

Furthermore, in the semiconductor apparatus of the present disclosure including the above-described preferable configuration, the pad electrodes connected with the impedance element may be three or more pad electrodes. In addition, the three or more pad electrodes may be electrically connected with the impedance element using wiring that is set such that a conductor length, conductor material, a wire diameter, and electrical resistance are equal.

Furthermore, in the semiconductor apparatus of the present disclosure including the above-described preferable configuration, the semiconductor apparatus may be an image capturing apparatus with a stacked structure semiconductor chip in which a first semiconductor chip and a second semiconductor chip are stacked and electrically connected to each other. At this time, a pixel array section in which a pixel is arranged may be formed on the first semiconductor chip, and a peripheral circuit section of the pixel array section may be formed on the second semiconductor chip. Then, the impedance element is provided in the first semiconductor chip, and the at least two pad electrodes connected with the impedance element may be provided in the second semiconductor chip.

The temperature compensation system and the alarm system having the above-mentioned preferable configuration of the present disclosure include the temperature measuring unit. This temperature measuring unit can apply a certain voltage to a resistance element to calculate the temperature of the semiconductor chip from a value of the current flowing through the resistance element. Alternatively, this temperature measuring unit can cause a certain current to flow through the resistance element to calculate the temperature of the semiconductor chip from a value of the voltage across the resistance element.

<Semiconductor Apparatus Having Applied Technology According to Present Disclosure>

An example of the semiconductor apparatus to which the technology according to the present disclosure is applied can include an image capturing apparatus. The description is now given, as an example of the image capturing apparatus, of a complementary-metal-oxide semiconductor (CMOS) image sensor, which is a kind of the image capturing apparatus using an X-Y address scheme. The CMOS image sensor is produced by applying or partially using a CMOS process.

Configuration Example of CMOS Image Sensor

FIG. 1 is a system configuration diagram illustrating an overview of a basic configuration of a CMOS image sensor that is an example of a semiconductor apparatus of the present disclosure.

The CMOS image sensor 1 according to this example has a pixel array section 11 and a peripheral circuit section around the pixel array section 11 that are integrated on a semiconductor chip (semiconductor substrate) 10. The pixel array section 11 includes a pixel 20 arranged in a two-dimensional array in the row and column directions, that is, in a matrix. The pixel 20 includes a photoelectric transducer that generates a photo-charge having the amount of charge corresponding to the amount of incident light. Herein, the row direction refers to the arrangement direction of the pixels 20 in the pixel row, that is, the direction along the pixel row (so-called horizontal direction), and the column direction refers to the arrangement direction of the pixels 20 in the pixel column, that is, the direction along the pixel column (so-called vertical direction).

The peripheral circuit section around the pixel array section 11 has circuit units including, for example, such as a row selection unit 12, a column processing unit 13, a logic circuit unit 14, and a timing control unit 15. The description is given below for the function of each component of the row selection unit 12, the column processing unit 13, the logic circuit unit 14, the timing control unit 15, and the like.

The row selection unit 12 includes a shift register, an address decoder, and the like and controls the scanning of the pixel row and the address of the pixel row upon selecting each pixel 20 of the pixel array section 11. Although the detailed configuration of the row selection unit 12 is not illustrated, it typically has two scanning systems, a read scanning system and a sweep scanning system.

The read scanning system selectively scans the pixels 20 in the pixel array section 11 in sequence row by row to read a pixel signal from the pixel 20. The pixel signal that is read from the pixel 20 is an analog signal. The sweep scanning system performs sweep scanning on the read row that has been subjected to the read scanning by the read scanning system. The sweep scanning system performs the sweep scanning, preceding the read scanning by the time taken for the shutter speed.

The sweep scanning by the sweep scanning system causes unnecessary charges to be swept out from a photoelectric converter of the pixel 20 in the read row, resetting the photoelectric converter. Then, the sweeping out (resetting) of unnecessary charges by the sweeping scanning system operates so-called an electronic shutter mode. The electronic shutter mode herein refers to an operation of discarding the photo-charge of the photoelectric converter and newly starting an exposure (starting photo-charge accumulation).

The pixel signal read from each pixel 20 in the pixel row selected by the row selection unit 12 is supplied to the column processing unit 13 in each pixel column. The column processing unit 13 has, for example, an analog-digital converter (ADC) or the like that converts an analog pixel signal output from the pixel 20 into a digital pixel signal.

An example of the analog-to-digital converter of the column processing unit 13 can include a single-slope analog-digital converter that is one example of a reference signal comparison analog-to-digital converter. Examples of the analog-to-digital converter are, however, not limited to the single-slope analog-to-digital converter, and they can include a sequential comparison analog-to-digital converter, a delta-sigma modulation ($\Delta\Sigma$ modulation) analog-digital converter, or the like.

The logic circuit unit 14 has, for example, an arithmetic processing function or the like and executes predetermined signal processing on the pixel signal that is read through the column processing unit 13 from each pixel 20 of the pixel array section 11 for outputting.

The timing control unit 15 generates various timing signals, clock signals, control signals, and the like to control the driving of the row selection unit 12, the column processing unit 13, the logic circuit unit 14, and the like on the basis of the generated signals.

The image capturing apparatus that is a typical example of the CMOS image sensor 1 having the configuration mentioned above is equipped with a temperature sensor 16 in the device to sense the internal temperature of the device. The temperature sensor 16 is configured to generate the temperature inside the device by, for example, using a technique similar to that used in the bandgap voltage reference circuit known in the art.

The temperature sensor 16 that senses the internal temperature of the device is preferably formed in the region where the peripheral circuit section of the pixel array section 11 is formed. The part where the temperature rises during the operation of the device in the CMOS image sensor 1 seems to be, for example, the column processing unit 13 among components in the peripheral circuit section. Thus, in this example, the temperature sensor 16 is formed in the region where the column processing unit 13 is formed.

Circuit Configuration Example of Pixel

Figure 2:
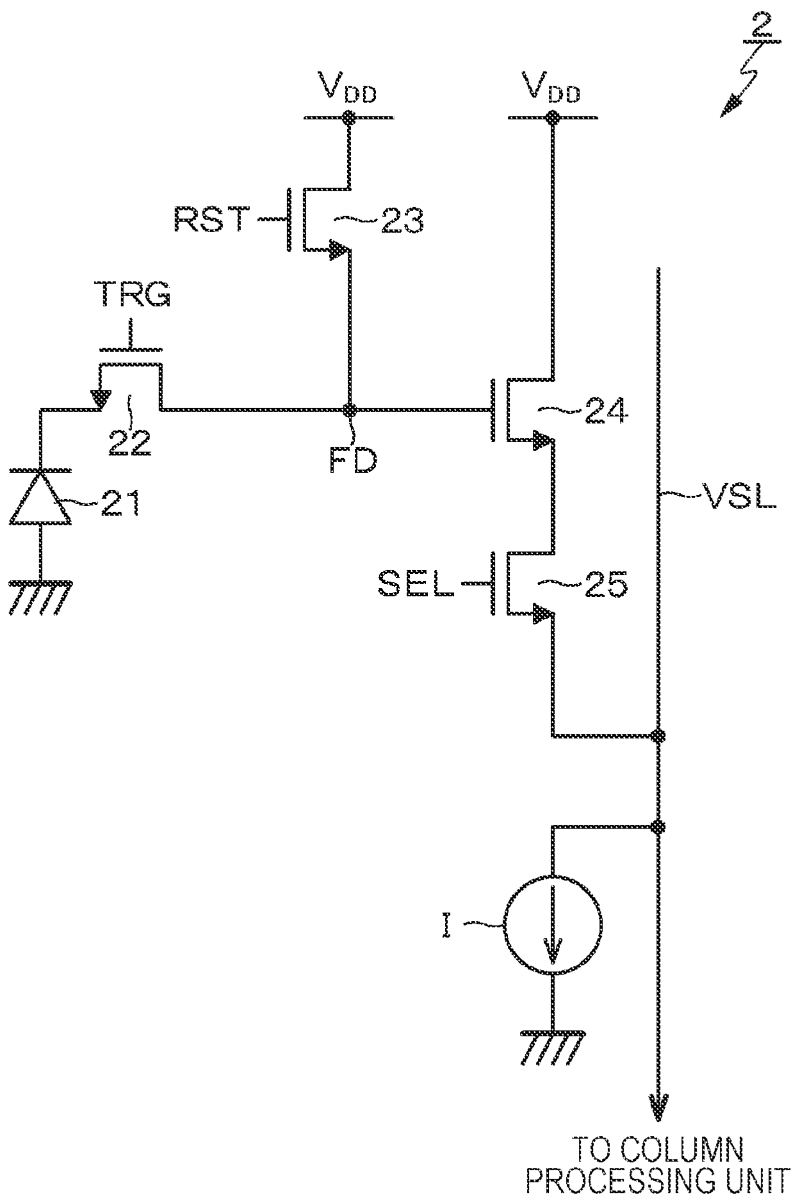
FIG. 2 is a circuit diagram illustrating an example of a circuit configuration of a pixel.

FIG. 2 is a circuit diagram illustrating an example of a circuit configuration of the pixel 20. The pixel 20 has, for example, a photodiode 21 functioning as the photoelectric transducer (photodetector). The pixel 20 has a pixel configuration including a transfer transistor 22, a reset transistor 23, an amplification transistor 24, and a selection transistor 25 in addition to the photodiode 21.

Moreover, herein, this example employs an N-channel MOS field effect transistor (FET) as four transistors of transfer transistor 22, reset transistor 23, amplification transistor 24, and selection transistor 25. However, the combination of the conductive types of these four transistors 22 to 25 exemplified herein is only illustrative and is not limited to the combinations described or illustrated.

The row selection unit 12 described above appropriately supplies the pixel 20 with a transfer signal TRG, a reset signal RST, and a selection signal SEL.

The photodiode 21 has an anode electrode connected to a low-potential side power supply (e.g., ground) and photoelectrically converts the received light into a photo-charge having the amount of charge corresponding to the amount of the received light (a photoelectron in this example) for accumulation of the photo-charge. The photodiode 21 has a cathode electrode electrically connected to a gate electrode of the amplification transistor 24 via the transfer transistor 22. Herein, the electrical connecting region with the gate electrode of the amplification transistor 24 becomes a floating diffusion (FD) region (or impurity diffusion region). The floating diffusion FD is a charge-voltage converter that converts an electric charge into a voltage.

The transfer signal TRG in which a high level (e.g., level of $V_{DD}$) is active is supplied from the row selection unit 12 to the gate electrode of the transfer transistor 22. The transfer transistor 22 then responds to the transfer signal TRG to be conductive. The transfer transistor 22 transfers the photo-charge, which is photoelectrically converted by the photodiode 21 and accumulated in the photodiode 21, to the floating diffusion FD.

The reset transistor 23 is connected between a node of the high-potential side power supply voltage $V_{DD}$ and the floating diffusion FD. The reset signal RST in which a high level is active is supplied from the row selection unit 12 to a gate electrode of the reset transistor 23. The reset transistor 23 then responds to the reset signal RST to be conductive. The reset transistor 23 ejects the charge of the floating diffusion FD to the node of the voltage $V_{DD}$, resetting the floating diffusion FD.

The amplification transistor 24 has the gate electrode connected to the floating diffusion FD and a drain electrode connected to the node of the high-potential side power supply voltage $V_{DD}$. The amplification transistor 24 functions as an input unit for a source follower that reads out a signal obtained by photoelectric conversion in the photodiode 21. In other words, the amplification transistor 24 has a source electrode connected to a vertical signal line VSL via the selection transistor 25. Then, the amplification transistor 24 and a current source I constitute a source follower that converts the voltage of the floating diffusion FD into the potential of the vertical signal line VSL. The current source I is connected to one end of the vertical signal line VSL.

The selection transistor 25 has a drain electrode connected to the source electrode of the amplification transistor 24 and a source electrode connected to the vertical signal line VSL. The selection signal SEL in which a high level is active is supplied from the row selection unit 12 to the gate electrode of the selection transistor 25. The selection transistor 25 then responds to the selection signal SEL to be conductive, which causes the pixel 20 to be the selection state, and delivers the signal being output from the amplification transistor 24 to the vertical signal line VSL.

Moreover, this example exemplifies, as a pixel circuit in the pixel 20, the 4-Tr configuration including the transfer transistor 22, the reset transistor 23, the amplification transistor 24, and the selection transistor 25, that is, four transistors (Tr). The pixel circuit is not limited to the configuration in this example. In one example, the 3-Tr configuration in which the selection transistor 25 is omitted and the amplification transistor 24 is caused to have the function of the selection transistor 25 can be employed. The configuration of 5-Tr or more having the increased number of transistors can be employed as necessary.

[Semiconductor Chip Structure]

The semiconductor chip of the CMOS image sensor 1 described above has so-called a flat plane structure, as is apparent from FIG. 1. The flat plane structure refers to the structure of a chip in which the peripheral circuit section is formed on the same semiconductor chip (semiconductor substrate) 10 as the pixel array section 11 having the pixels 20 arranged therein. The peripheral circuit section of the pixel array section 11 includes the row selection unit 12, the column processing unit 13, the logic circuit unit 14, the timing control unit 15, and the like.

The semiconductor chip structure of the CMOS image sensor 1 is not limited to the flat plane structure and can be so-called a stacked structure. The stacked structure is a chip structure in which the peripheral circuit section of the pixel array section 11 is formed on at least one semiconductor substrate different from the semiconductor substrate on which the pixel array section 11 is formed. Such a stacked structure allows the size (area) of the first-placed layer semiconductor substrate to be sufficient to form the pixel array section 11, which reduces the first-placed layer semiconductor substrate and even the size of the entire chip. Furthermore, a process suitable for manufacturing the pixel 20 is applicable to the first-placed semiconductor substrate and a process suitable for manufacturing the circuit portion is applicable to the other semiconductor substrate. This allows an advantage of obtaining the optimization of processes in manufacturing the CMOS image sensor 1.

[Measurement of In-Plane Temperature of Wafer Using Thermocouple]

In addition, application examples of the image capturing apparatus represented by the CMOS image sensor can include, for example, an in-vehicle image sensor mounted on a vehicle for capturing an image or the like of the outside of the vehicle. However, the in-vehicle image sensor is illustrative and is not limited to the in-vehicle use application.

Figure 3A:
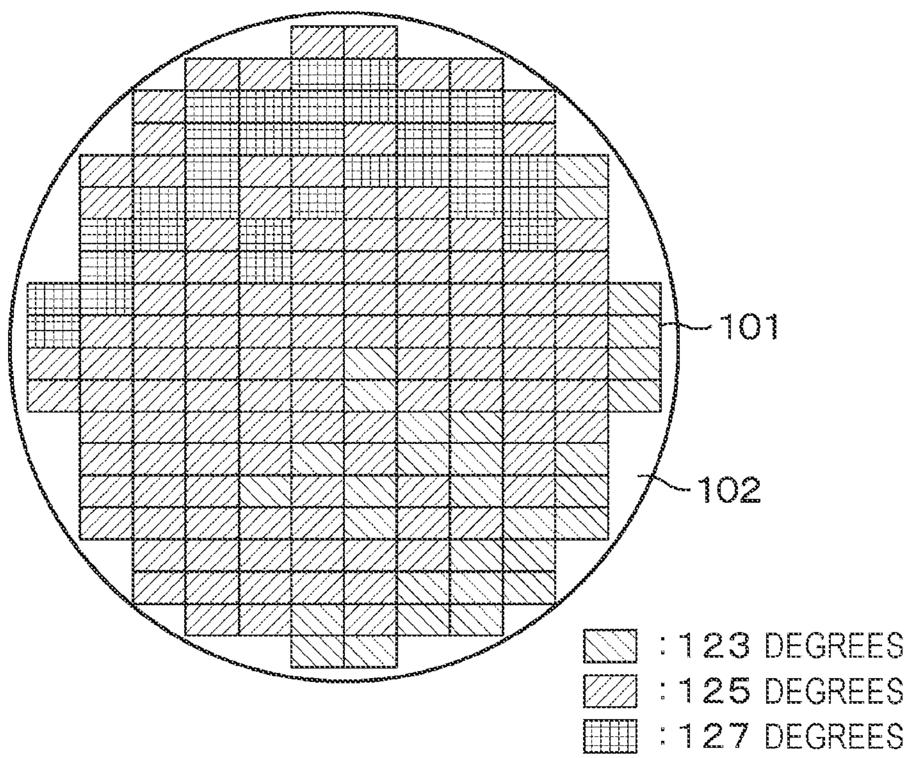
FIG. 3A is a diagram illustrating an example of an actual temperature at each semiconductor chip portion in a wafer.
Figure 3B:
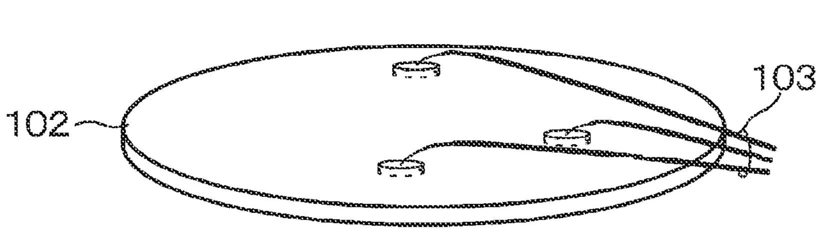
FIG. 3B is a diagram illustrated to describe a measurement of the in-plane temperature of the wafer with a thermocouple.

The in-vehicle image sensor is equipped with a temperature sensor (thermometer) inside the device to stop the operation of a system upon reaching the upper limit temperature as the safety performance. The temperature sensor requires a high sensing accuracy of ±1 degree, particularly in the high temperature range. Thus, the fluctuations in an individual device are corrected by bringing a wafer 102 on which the semiconductor chip 101 is arranged as illustrated in FIG. 3A, for example, into contact with a thermocouple 103 as illustrated in FIG. 3B, measuring the temperature of the device. The temperature sensed by the temperature sensor is compensated on the basis of results obtained by the temperature measurements.

The challenge caused by this temperature compensation is fluctuations in the in-plane temperatures of a wafer. Therefore, it is necessary to measure the temperature for each semiconductor chip and compensate for the temperature measured by the temperature sensor for each semiconductor chip, however, in the above-described traditional technique to measure the in-plane temperature of the wafer by bringing the pad electrode in contact with the thermocouple, it is not possible to recognize the actual temperature for each semiconductor chip while driving the device. For this reason, the difference between the temperature set in the wafer prober and the actual temperature is a temperature compensation error, which makes it difficult to achieve an accuracy of ±1 degree, especially in a high temperature range. Moreover, FIG. 3A illustrates the actual temperature of each semiconductor chip 101 (e.g., temperatures of 123, 125, and 127 degrees) in the wafer 102 in the case where the temperature set in the wafer prober is, for example, 125 degrees.

First Embodiment

The image capturing apparatus is an example of the semiconductor apparatus according to the first embodiment of the present disclosure. The CMOS image sensor 1, a specific example of the image capturing apparatus, is equipped inside the device with the temperature sensor 16. The temperature sensor 16 for sensing the internal temperature of the device is capable of recognizing (measuring) the actual temperature in units of semiconductor chips (hereinafter can be simply referred to as "in chip units") while driving the device.

The CMOS image sensor 1 according to the present embodiment has a configuration in which an impedance element is electrically connected between at least two pad electrodes among a plurality of pad electrodes formed in the semiconductor chip 10, allowing recognition of the actual temperature in chip units. In addition, upon measuring the actual temperature of the semiconductor chip 10, a certain electrical signal (certain voltage or current) is applied between the at least two pad electrodes connected with the impedance element from the outside of the semiconductor chip 10.

Figure 4A:
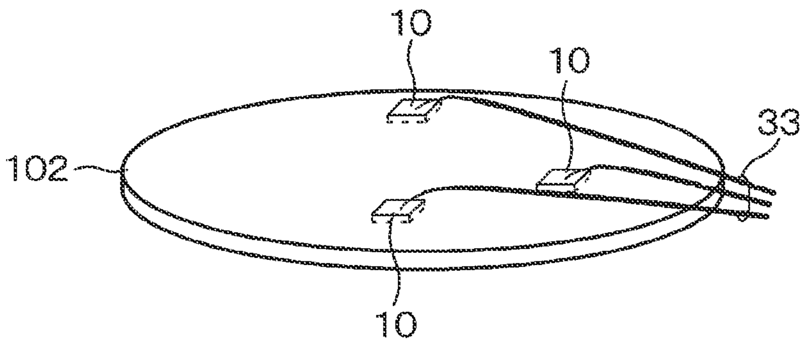
FIG. 4A is a diagram illustrating a relationship between a measuring targeting semiconductor chip on a wafer and a probe needle in a semiconductor apparatus according to a first embodiment of the present disclosure.
Figure 4B:
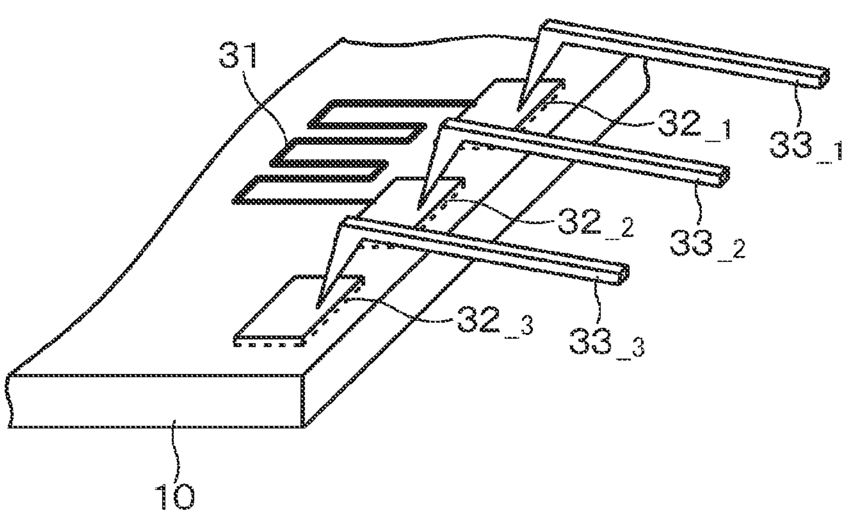
FIG. 4B is a diagram illustrating a configuration of applying a certain electrical signal, through a probe needle, between two pad electrodes connected with a resistance element to measure the temperature.

An example usable as the impedance element implemented in the semiconductor chip 10 can include a temperature-dependent element, for example, a resistance element 31, as illustrated in FIG. 4A. A certain electrical signal (certain voltage or current) is then applied between pad electrodes 32$_{\_1}$ and 32$_{\_2}$ connected with the resistance element 31, through a probe needle 33 (33$_{\_1}$, 33$_{\_2}$), in each semiconductor chip 10 in the wafer 102, as illustrated in FIG. 4B. This configuration makes it possible to cause the resistance element 31 to have temperature dependence, measuring the current or voltage proportional to the actual temperature for each semiconductor chip 10 in the wafer 102 in chip units.

Moreover, the resistance element is herein exemplified as a component for temperature measurement to be implemented inside the semiconductor chip 10. The temperature measuring component is not limited to the resistance element and can include an impedance element such as a diode in addition to the resistance element. In addition, a pad electrode 32$_{\_3}$ is supplied with a clock, a voltage, or the like through a probe needle 33$_{\_3}$.

The resistance element 31, one example implemented in the semiconductor chip 10 for temperature measurement, is applied with the certain electrical signal (certain voltage or current) from the outside of the semiconductor chip 10, as described above. This makes it possible to measure the current or voltage proportional to the actual temperature of the semiconductor chip 10, measuring the actual temperature in chip units while driving the device. Furthermore, using the resistance element 31 implemented in the semiconductor chip 10 as a sensor makes it possible to sense the actual temperature of the semiconductor chip 10 even for the assembly component of the CMOS image sensor 1.

The description is now given for a specific example of implementing the resistance element 31 as an impedance element in the semiconductor chip 10 and measuring the actual temperature of the semiconductor chip 10 in chip units.

Example 1

Figure 5A:
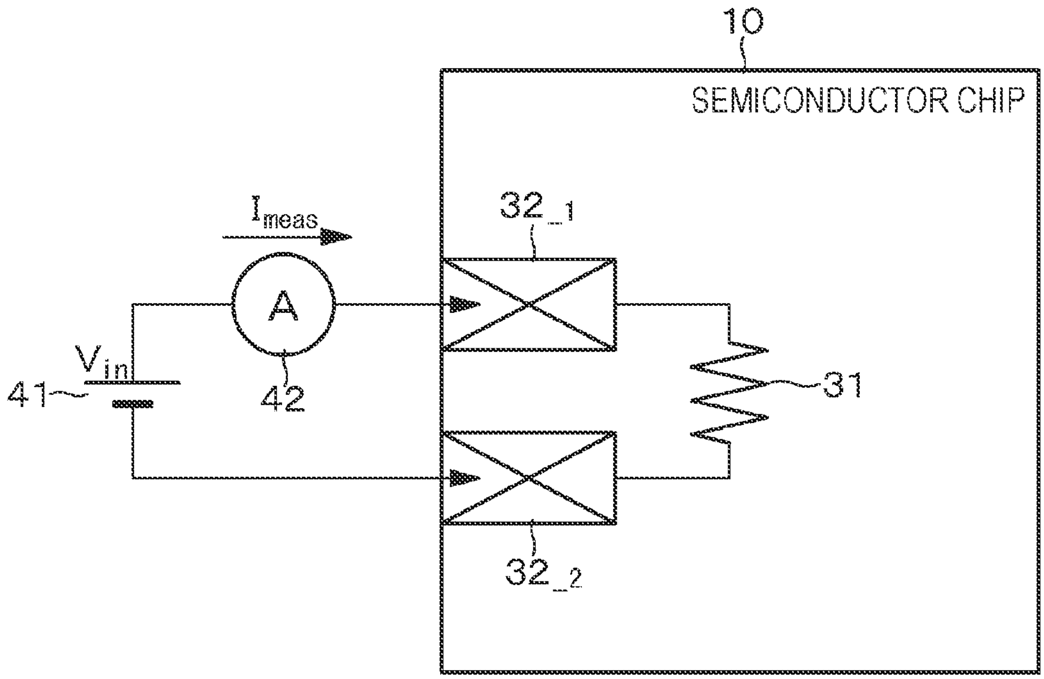
FIG. 5A is a circuit diagram illustrating an example of a temperature measurement configuration according to Example 1.
Figure 5B:
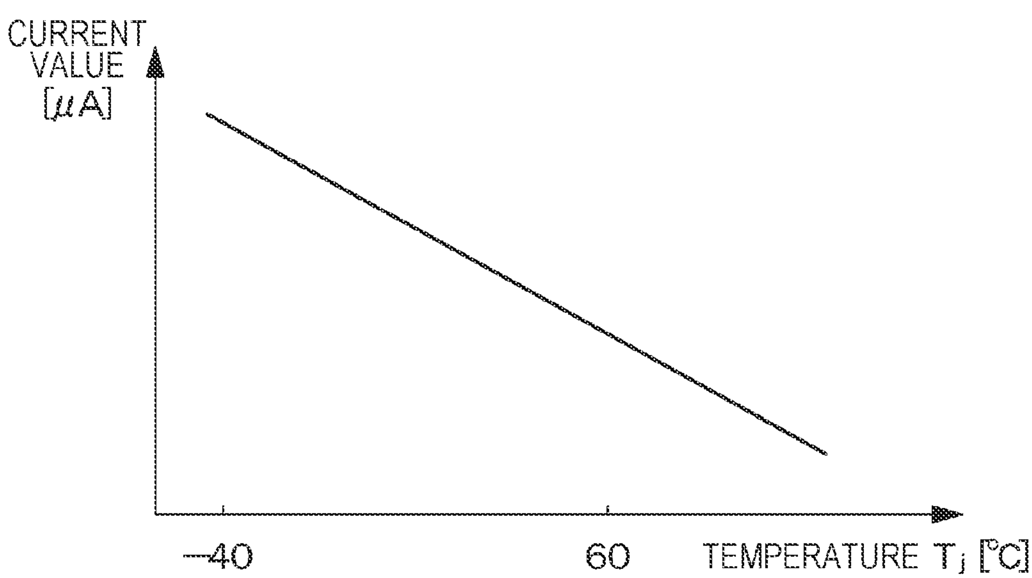
FIG. 5B is a diagram illustrating an example of the relationship between a value of current flowing through a resistance element and a temperature.

Example 1 is an example of applying a certain voltage to the resistance element 31 to measure the actual temperature of the semiconductor chip 10. FIG. 5A illustrates an example of the configuration for the temperature measurement according to Example 1. Furthermore, FIG. 5B illustrates an example of the relationship between a value of current flowing through the resistance element 31 and a temperature TJ. However, the relationship in FIG. 5B in which the current value decreases as the temperature TJ increases is an example, and the present invention is not limited to this relationship.

As illustrated in FIG. 5A, the temperature measurement according to Example 1 is performed by applying a certain voltage Vin between the pad electrodes 32$_{\_1}$ and 32$_{\_2}$ connected with the resistance element 31 from the voltage source 41 and measuring a value $I_{meas}$ of the current flowing through the resistance element 31 with an ammeter 42. This configuration allows the ammeter 42 to measure the current value $I_{meas}$ corresponding to the resistance value of the resistance element 31. This current value $I_{meas}$ reflects the properties of the resistive material of the resistance element 31.

The temperature measurement according to Example 1 applies the certain voltage $V_{in}$ to the resistance element 31, allowing the measurement of the current value $I_{meas}$ that reflects the properties of the resistive material of the temperature-dependent resistance element 31, as described above. This measured current value $I_{meas}$ enables the calculation of the internal temperature of the semiconductor chip 10. The calculated temperature is then usable as a compensating temperature to compensate for the temperature sensed by the temperature sensor 16 (see FIG. 1) equipped in the semiconductor chip 10 of the CMOS image sensor 1.

Example 2

Figure 6A:
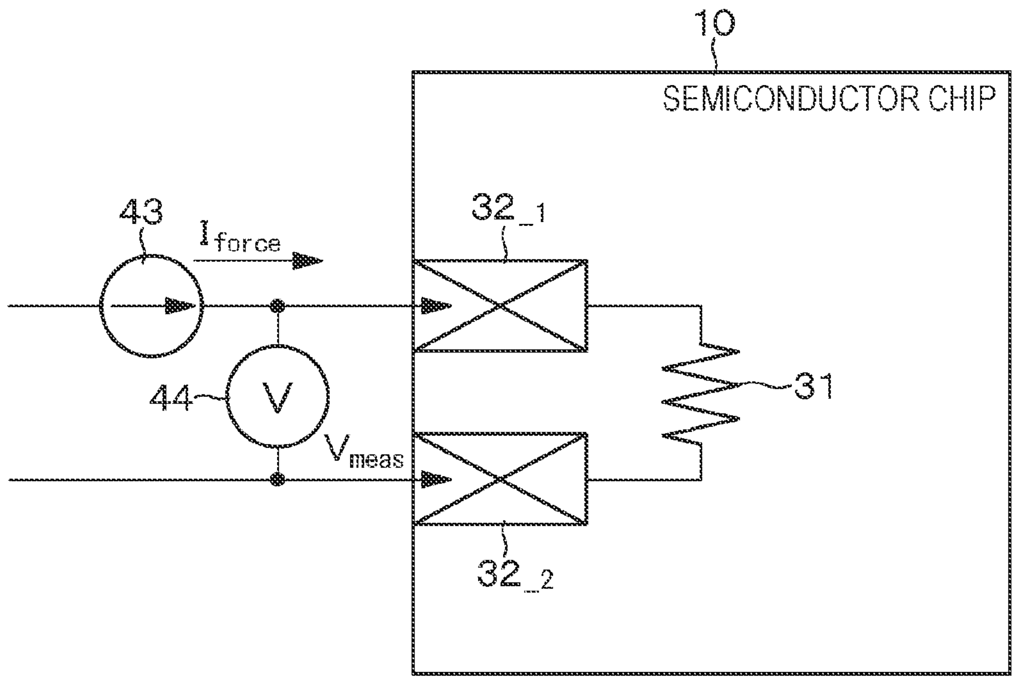
FIG. 6A is a circuit diagram illustrating a configuration example for temperature measurement according to Example 2.

Example 2 is an example of causing a certain current to flow through the resistance element 31 to measure the actual temperature of the semiconductor chip 10. FIG. 6A illustrates an example of the configuration for the temperature measurement according to Example 2.

The temperature measurement according to Example 2 as illustrated in FIG. 6A causes a certain current $I_{force}$ to flow from a current source 43 via the pad electrode 32_1 through the resistance element 31, measuring a value of voltage across both ends of the resistance element 31 with a voltmeter 44 that is connected between the pad electrodes 32_1 and 32_2. This configuration allows the voltmeter 44 to measure the voltage value $V_{meas}$ corresponding to the resistance value of the resistance element 31. This voltage value $V_{meas}$ reflects the properties of the resistive material of the resistance element 31.

The temperature measurement according to Example 2 causes the certain current $I_{force}$ to flow through the resistance element 31, allowing the measurement of the voltage value $V_{meas}$ that reflects the properties of the resistive material of the temperature-dependent resistance element 31, as described above. This measured voltage value $V_{meas}$ enables the calculation of the internal temperature of the semiconductor chip 10. The calculated temperature is then usable as a compensating temperature to compensate for the temperature sensed by the temperature sensor 16.

Example 3

Figure 6B:
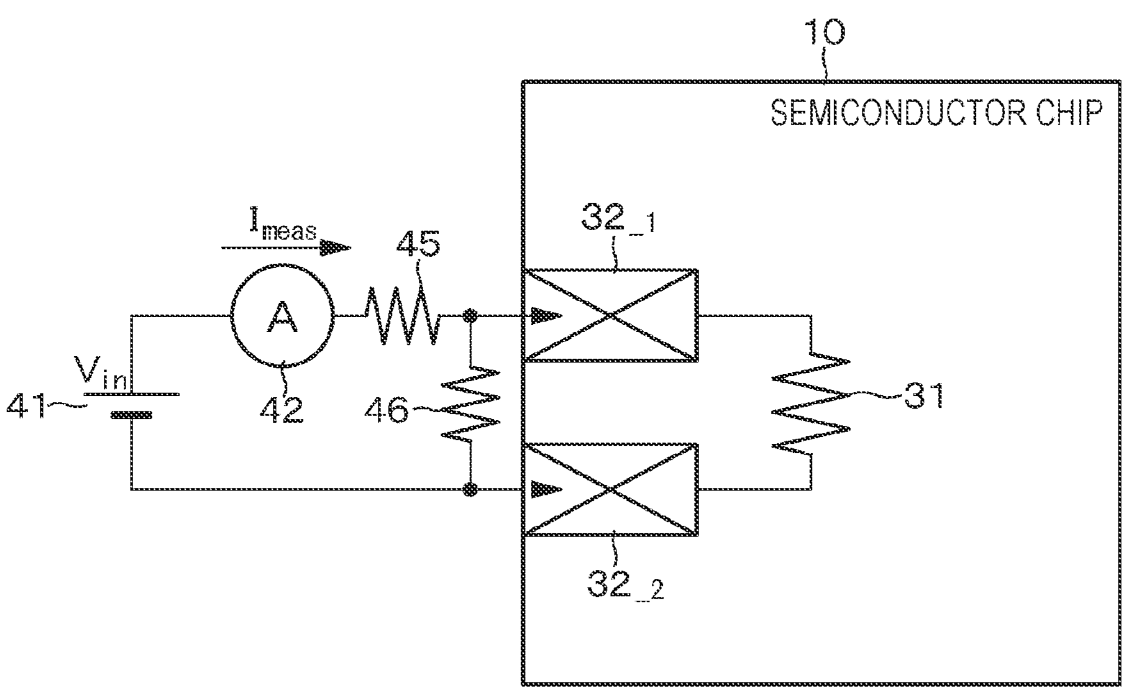
FIG. 6B is a circuit diagram illustrating a configuration example for temperature measurement according to Example 3.

Example 3 is a modification of Example 1 and illustrates an example in which a referenced resistance element is provided in the measurement system. FIG. 6B illustrates an example of the configuration for the temperature measurement according to Example 3.

The temperature measurement according to Example 3 uses a configuration having a reference resistance element 46 connected between the pad electrodes 32_1 and 32_2 as illustrated in FIG. 6B, considering that a resistance component 45 of the measurement system is provided between the ammeter 42 and the pad electrode 32_1 in the measurement system according to Example 1. The reference resistance element 46 has the measurement accuracy that deteriorates with the increasing influence of the resistance component 45 of the measurement system outside the semiconductor chip 10. For this reason, the reference resistance element 46 is interposed between the pad electrodes 32_1 and 32_2.

The temperature measurement according to Example 3 described above has the same basic configuration as the temperature measurement according to Example 1. Thus, it is possible to measure the current value $I_{meas}$, which reflects the properties of the resistive material of the temperature-dependent resistance element 31, and calculate the internal temperature of the semiconductor chip 10 using the measured current value $I_{meas}$. In particular, the temperature measurement according to Example 3 is provided with the reference resistance element 46, thus allowing the calculation of the resistance value of the resistance component 45 of the measurement system while performing the measurement considering the presence of the resistance component 45.

Example 4

Figure 7:
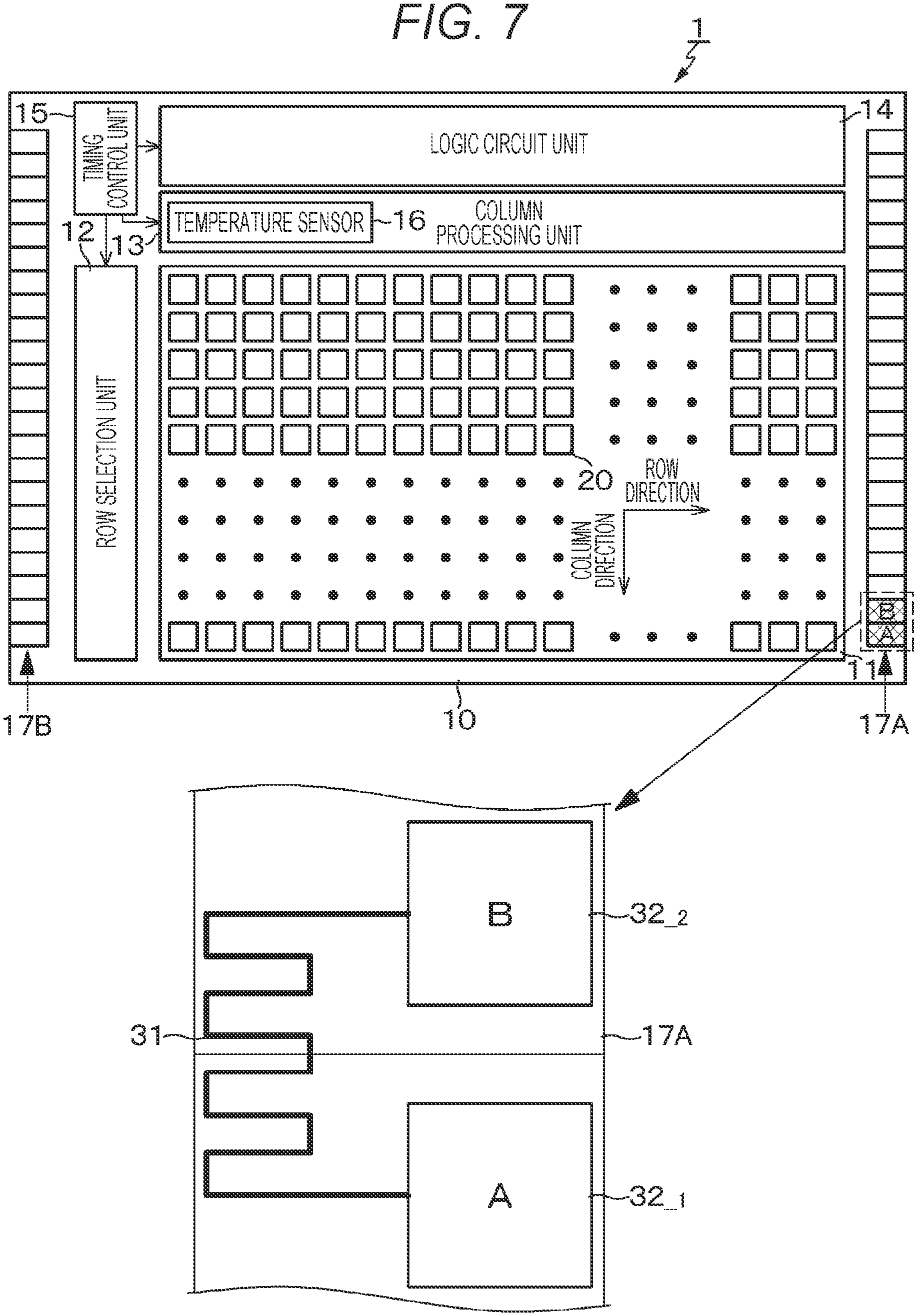
FIG. 7 is a diagram illustrating an example of a pad electrode arrangement structure according to Example 4.

Example 4 is an example of the arrangement structure of the pad electrodes connected with the resistance element 31. FIG. 7 illustrates an example of the pad electrode arrangement structure according to Example 4.

As illustrated in FIG. 7, in the semiconductor chip 10 of the CMOS image sensor 1, pad electrode groups 17A and 17B including a set of pad electrodes used for input or output of various signals are provided at, for example, both ends in the row direction. The pad electrodes of these pad electrode groups 17A and 17B are then capable of using as the pad electrodes connected with the resistance element 31. In this example, two electrodes A and B at the ends of the pad electrode group 17A are used as the two pad electrodes 32_1 and 32_2 connected with the resistance element 31.

The arrangement structure of the pad electrodes according to Example 4 uses the pad electrodes of the pad electrode group 17A as the two pad electrodes 32_1 and 32_2, but instead thereof, the pad electrodes of the pad electrode group 17B can be used. The pad electrodes are not limited to the pad electrodes at the end of the pad electrode groups 17A and 17B and can use pad electrodes in the middle of the pad electrode groups. In addition, although the number of pad electrodes connected with the resistance element 31 is exemplified as two, the number is not limited to two as long as they are electrically connected between the pad electrodes. The number of pad electrodes is optional.

Example 5

Figure 8:
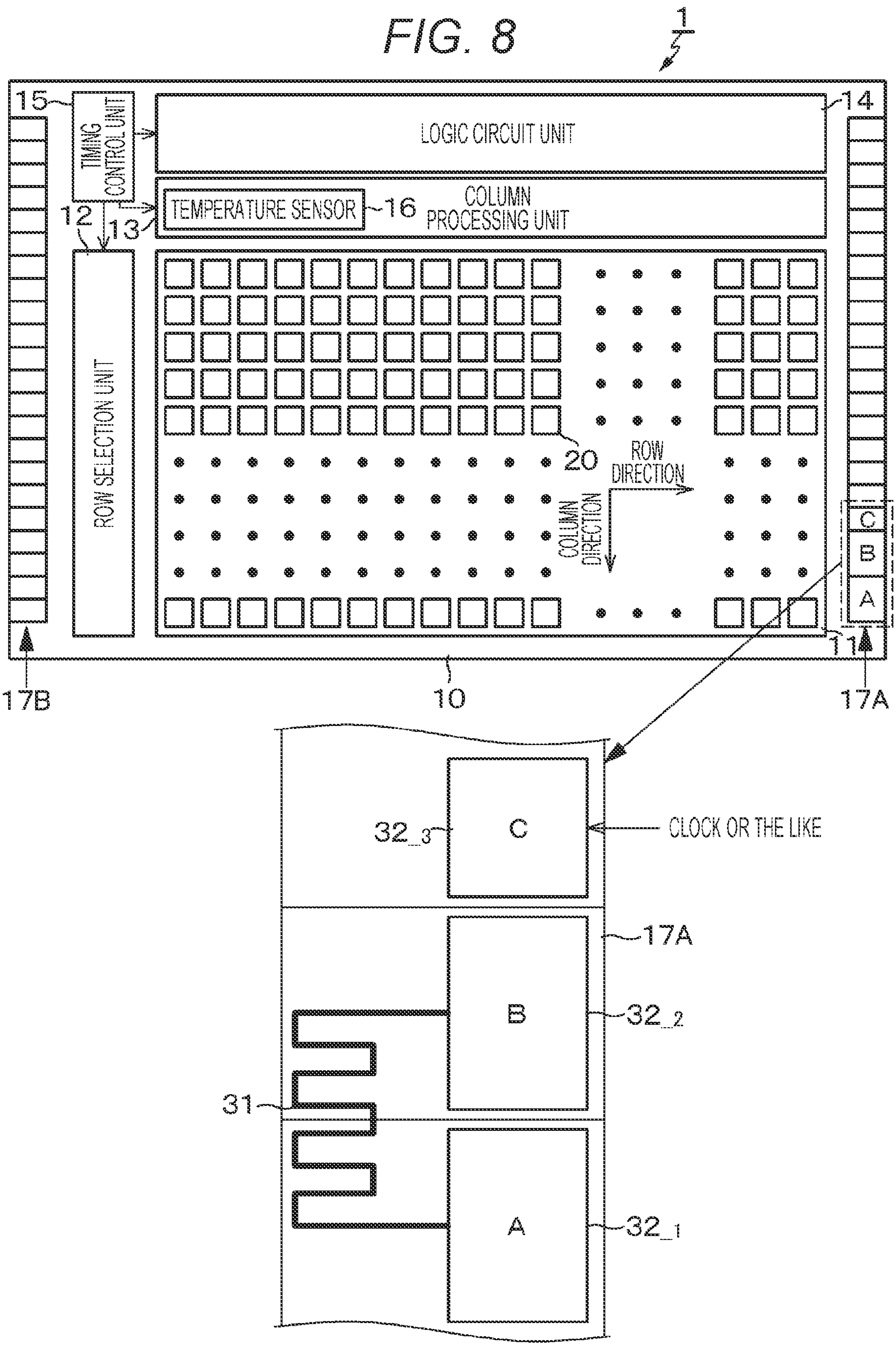
FIG. 8 is a diagram illustrating an example of a pad electrode arrangement structure according to Example 5.

Example 5, which is a modification of Example 4, is an example of the two pad electrodes connected with the resistance element having a size larger than that of another pad electrode. FIG. 8 illustrates an example of the pad electrode arrangement structure according to Example 5.

In the pad electrode arrangement structure according to Example 5 illustrated in FIG. 8, the two pad electrodes 32_1 and 32_2 connected with the resistance element 31 has the size set to larger than the size of another pad electrode of the pad electrode group 17A. An example of the other pad electrode is the pad electrode 32_3 supplied with a clock signal or the like from the outside of the chip.

Making the size of the two pad electrodes 32_1 and 32_2 connected with the resistance element 31 larger than that of the other pad electrode as described above makes it possible to lower the resistance value of the two pad electrodes 32_1 and 32_2 than that of the other pad electrode depending on the reduced size.

Example 6

Figure 9:
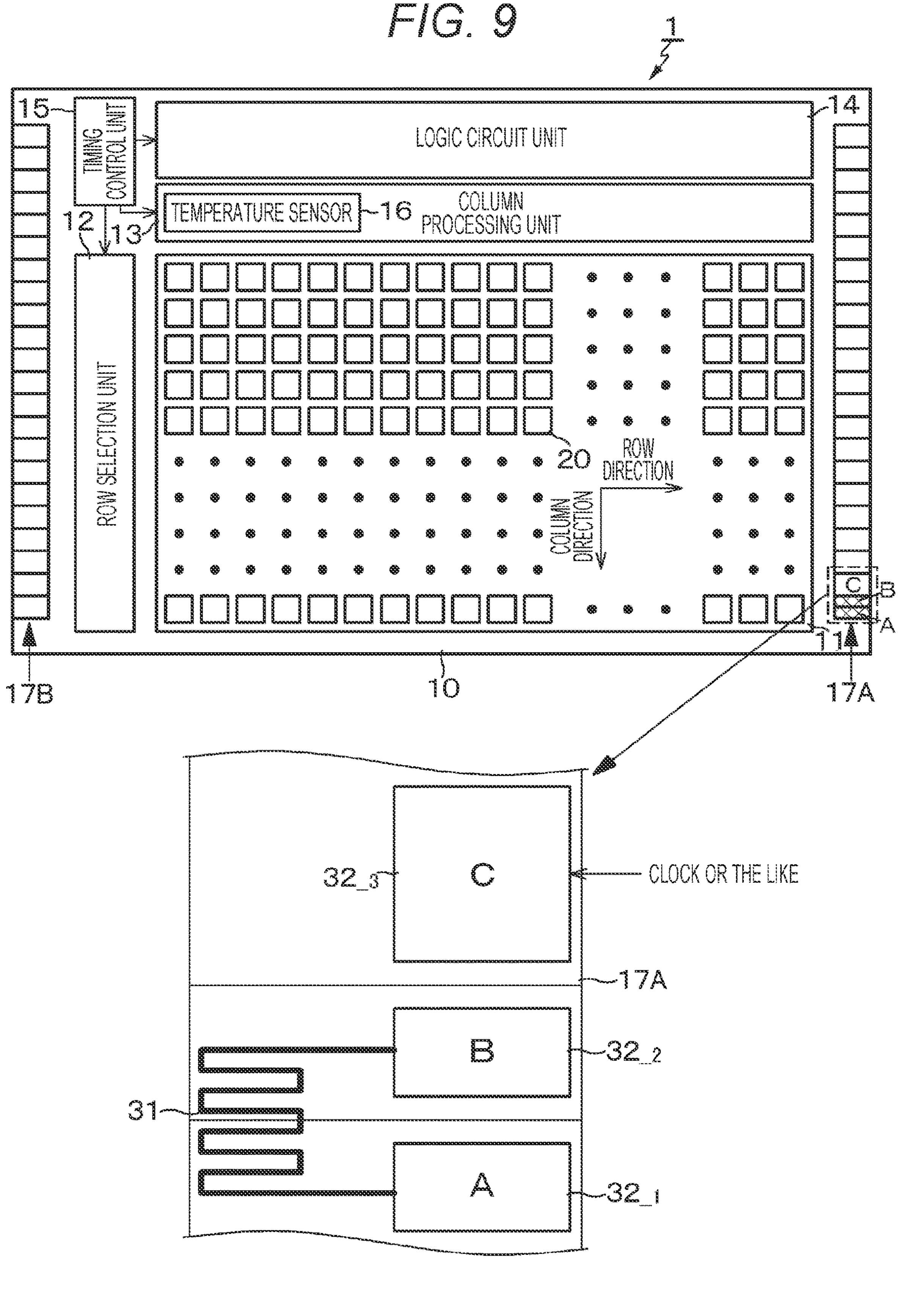
FIG. 9 is a diagram illustrating an example of a pad electrode arrangement structure according to Example 6.

Example 6, which is a modification of Example 4, includes the two pad electrodes connected with resistance element 31 having a size smaller than another pad electrode. FIG. 9 illustrates an example of the pad electrode arrangement structure according to Example 6.

In the pad electrode arrangement structure according to Example 6 illustrated in FIG. 9, the two pad electrodes 32_1 and 32_2 connected with the resistance element 31 has the size set to smaller than the size of another pad electrode of the pad electrode group 17A. An example of the other pad electrode is the pad electrode 32_3 supplied with a clock signal or the like from the outside of the chip.

Making the size of the two pad electrodes 32_1 and 32_2 connected with the resistance element 31 smaller than that of the other pad electrode as described above makes it possible to compact the area occupied by the two pad electrodes $\mathbf{32}_{1}$ and $\mathbf{32}_{2}$ in the region where the pad electrode group 17A is formed.

Example 7

Figure 10:
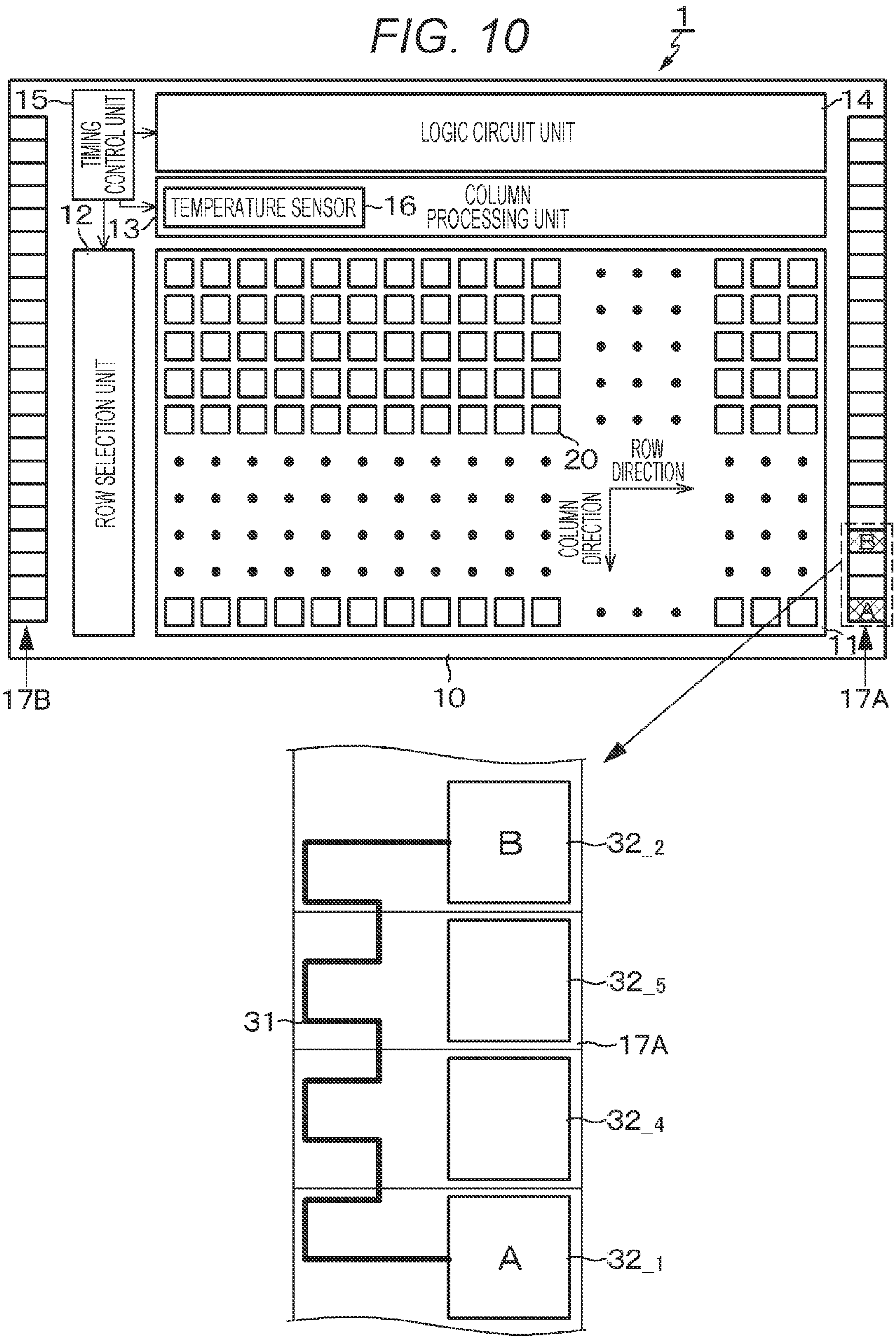
FIG. 10 is a diagram illustrating an example of a pad electrode arrangement structure according to Example 7.

Example 7, which is a modification of Example 4, is an example of sandwiching another pad electrode between two pad electrodes connected with a resistance element. FIG. 10 illustrates an example of the pad electrode arrangement structure according to Example 7.

In the pad electrode arrangement structure according to Example 7 illustrated in FIG. 10, the two pad electrodes $\mathbf{32}_{1}$ and $\mathbf{32}_{2}$ connected with the resistance element 31 are arranged to sandwich other pad electrodes in the pad electrode group 17A, for example, two pad electrodes $\mathbf{32}_{4}$ and $\mathbf{32}_{5}$.

Sandwiching another pad electrode of the pad electrode group 17A between the two pad electrodes $\mathbf{32}_{1}$ and $\mathbf{32}_{2}$ connected with the resistance element 31 as described above makes it possible to separate the two pad electrodes $\mathbf{32}_{1}$ and $\mathbf{32}_{2}$ to increase the distance between them. This enables the measurement of temperatures over a broader range than if they were arranged adjacently. This example illustrates that the number of pad electrodes sandwiched between the two pad electrodes $\mathbf{32}_{1}$ and $\mathbf{32}_{2}$ is set to two, but this number is illustrative and is not limited to two.

Example 8

Figure 11:
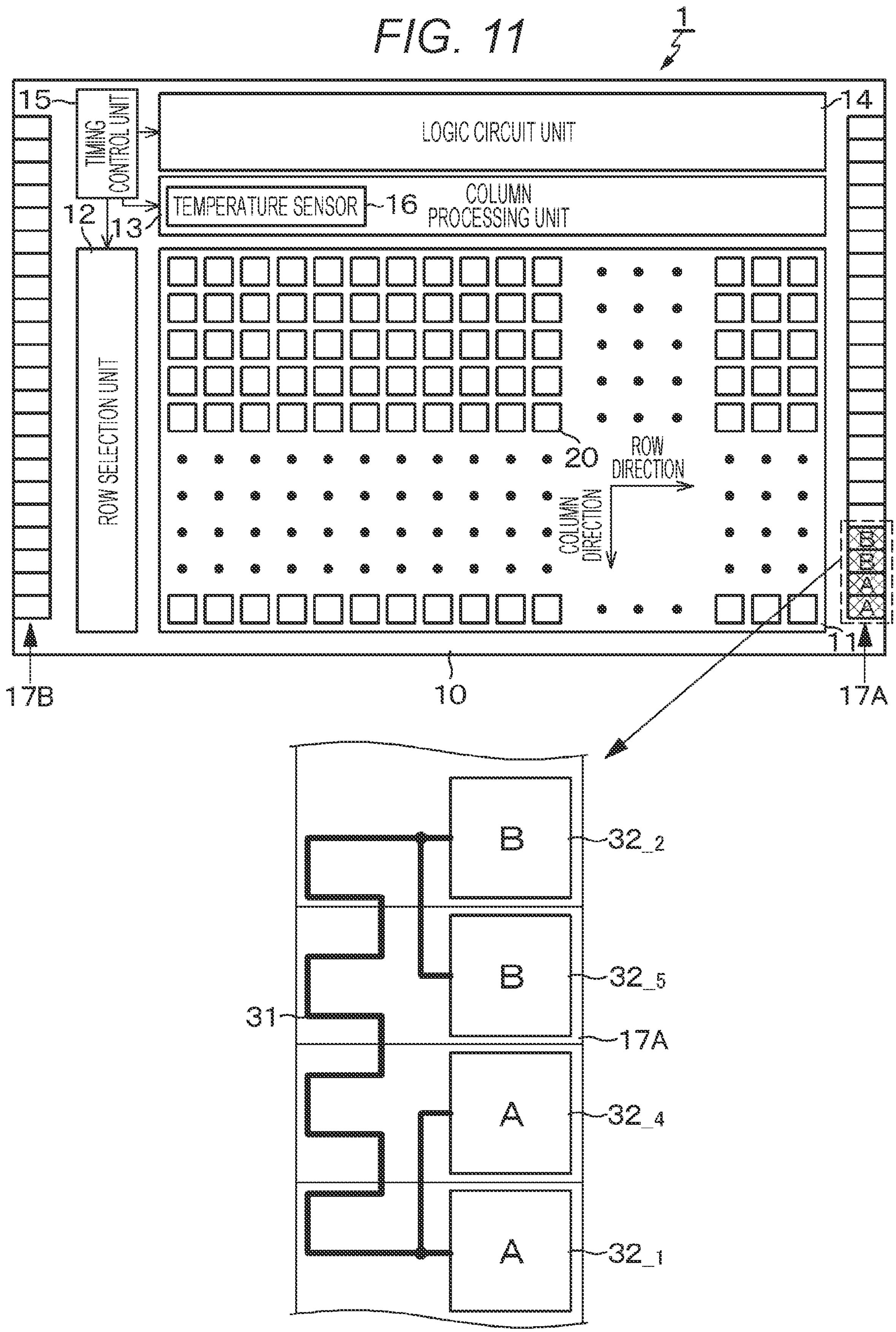
FIG. 11 is a diagram illustrating an example of a pad electrode arrangement structure according to Example 8.

Example 8, which is a modification of Example 4, is an example in which each of two pad electrodes connected with resistance element includes multiple pad electrodes. FIG. 11 illustrates an example of the pad electrode arrangement structure according to Example 8.

In the pad electrode arrangement structure according to Example 8 illustrated in FIG. 11, the two respective pad electrodes $\mathbf{32}_{1}$ and $\mathbf{32}_{2}$ connected with the resistance element 31 include multiple pad electrodes adjacent and electrically connected to each other in the pad electrode group 17A.

In this example, in the pad electrode group 17A, the pad electrodes $\mathbf{32}_{1}$ and $\mathbf{32}_{4}$, which are adjacent and electrically connected to each other, are used as one of the two pad electrodes ($\mathbf{32}_{1}$, $\mathbf{32}_{2}$) connected with the resistance element 31. In addition, the pad electrodes $\mathbf{32}_{2}$ and $\mathbf{32}_{5}$, which are adjacent and electrically connected to each other, are used as the other of the two pad electrodes connected with the resistance element 31.

Note that in the present example, the two respective pad electrodes connected with the resistance element 31 include two pad electrodes adjacent and electrically connected to each other in the pad electrode group 17A, however, the present invention is not limited thereto, and the number of pad electrodes is arbitrary.

The two respective pad electrodes $\mathbf{32}_{1}$ and $\mathbf{32}_{2}$ connected with the resistance element 31 include multiple pad electrodes as described above. This has a similar effect to the increased size of each pad electrode. It is possible to lower the resistance values of the two respective pad electrodes $\mathbf{32}_{1}$ and $\mathbf{32}_{2}$ than in the case of a pad electrode including one pad electrode. In addition, increasing the number of pad electrodes makes it possible to cancel the influence of the conductor resistance other than the resistance element 31, improving the accuracy of temperature measurement.

Example 9

Figure 12:
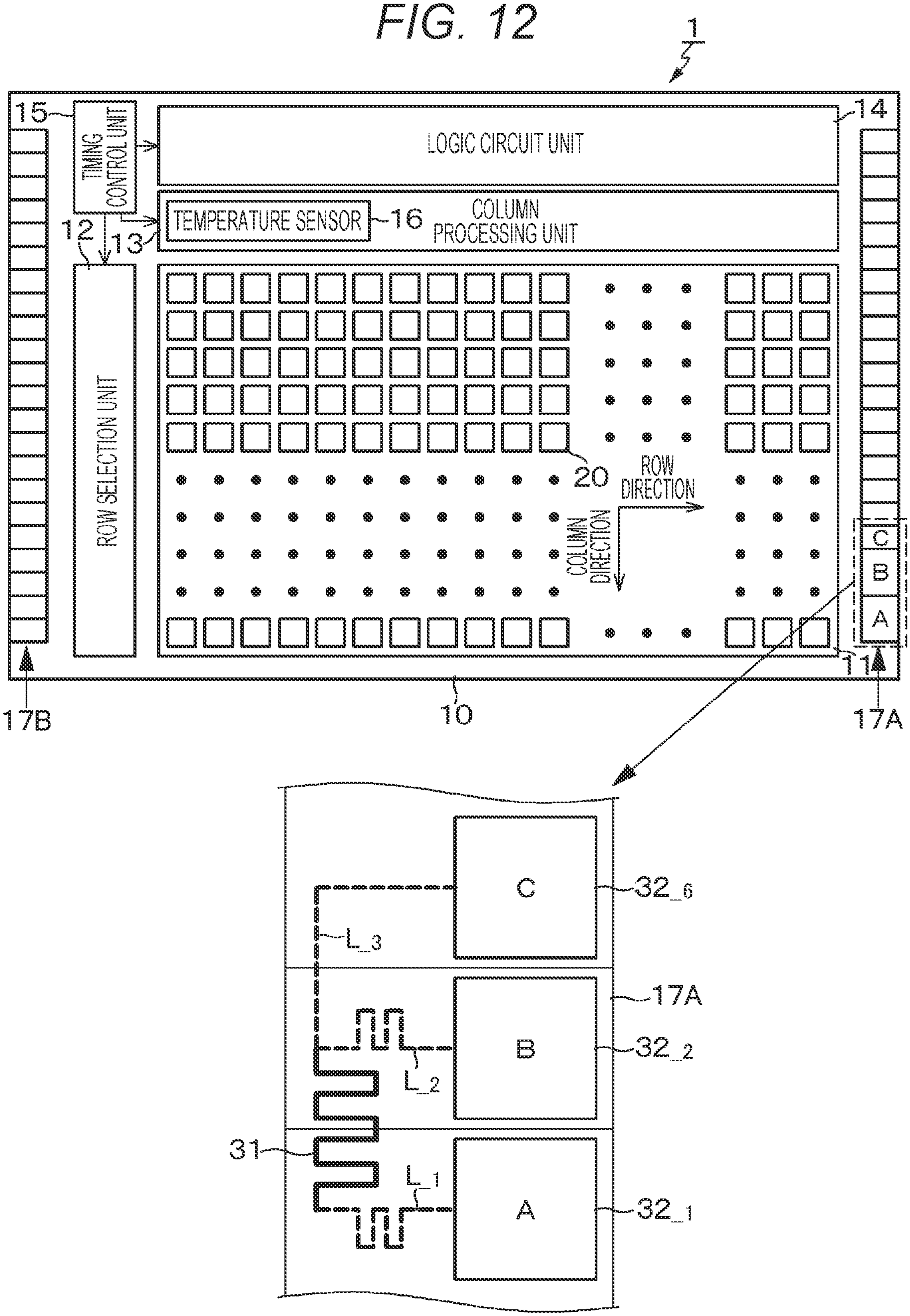
FIG. 12 is a diagram illustrating an example of a pad electrode arrangement structure according to Example 9.

Example 9, which is a modification of Example 8, is an example of three or more pad electrodes connected with resistance element. FIG. 12 illustrates an example of the pad electrode arrangement structure according to Example 9.

In the pad electrode arrangement structure according to Example 9 illustrated in FIG. 12, the number of pad electrodes connected with the resistance element 31 is set to three, for example, the pad electrode $\mathbf{32}_{1}$, the pad electrode $\mathbf{32}_{2}$, and a pad electrode $\mathbf{32}_{6}$, but three or more pad electrodes are usable.

The three or more pad electrodes, for example, three pad electrodes $\mathbf{32}_{1}$, $\mathbf{32}_{2}$, and $\mathbf{32}_{6}$ and the resistance element 31 are electrically connected by wiring. The wiring is set such that the conductor length ($L_{1}$, $L_{2}$, $L_{3}$), conductor material, wire diameter, and electrical resistance are equal (e.g., for the conductor length, $L_{1}=L_{2}=L_{3}$) using, for example, meander wiring or the like. The term "equal" herein means not only a case of exact equality but also a case of substantial equality, and the existence of various variations caused in design or manufacturing is tolerant.

The wirings that electrically connect the three pad electrodes $\mathbf{32}_{1}$, $\mathbf{32}_{2}$, and $\mathbf{32}_{6}$ with the resistance element 31, having the conductor length, conductor material, wire diameter, and electrical resistance being equal, makes it possible to cancel the influence of the conductor resistance, improving the accuracy of temperature measurement.

Example 10

Example 10 is an application example of two pad electrodes connected with a resistance element. The above description for Examples 1 to 9 is given about the case where the two pad electrodes $\mathbf{32}_{1}$ and $\mathbf{32}_{2}$ connected with the resistance element 31 employ the pad electrode dedicated to temperature measurement of the semiconductor chip 10 of the CMOS image sensor 1 to improve the sensing accuracy of the temperature sensor 16.

Figure 13A:
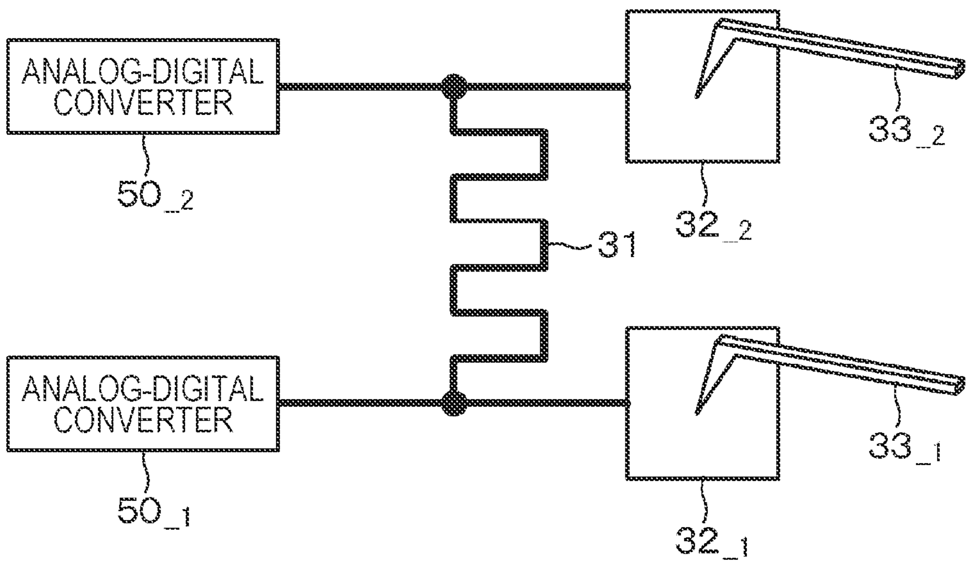
FIG. 13A is a diagram illustrating a pad electrode arrangement structure according to an application example (first application example)

The description for Example 10 is given on an application example in which the two pad electrodes $\mathbf{32}_{1}$ and $\mathbf{32}_{2}$ are used for other intended uses other than the pad electrode dedicated to temperature measurement. FIG. 13A illustrates the pad electrode arrangement structure according to the application example (first application example), and FIG. 13B illustrates the pad electrode arrangement structure according to the application example (second application example).

The application example (first application example) illustrated in FIG. 13A is an example in which the resistance element 31 and the two pad electrodes $\mathbf{32}_{1}$ and $\mathbf{32}_{2}$ are used as an overheat detector. Specifically, the wiring, which connects the two pad electrodes $\mathbf{32}_{1}$ and $\mathbf{32}_{2}$ with the resistance element 31, is connected to an analog-digital converter 50 ($\mathbf{50}_{1}$, $\mathbf{50}_{2}$) that is provided in the column processing unit 13 (see FIG. 1) in the semiconductor chip 10. The analog-digital converters $\mathbf{50}_{1}$ and $\mathbf{50}_{2}$ then can process the voltage across both ends of the resistance element 31 upon flowing a current through the two pad electrodes $\mathbf{32}_{1}$ and $\mathbf{32}_{2}$, thus detecting the overheating in the semiconductor chip 10.

Figure 13B:
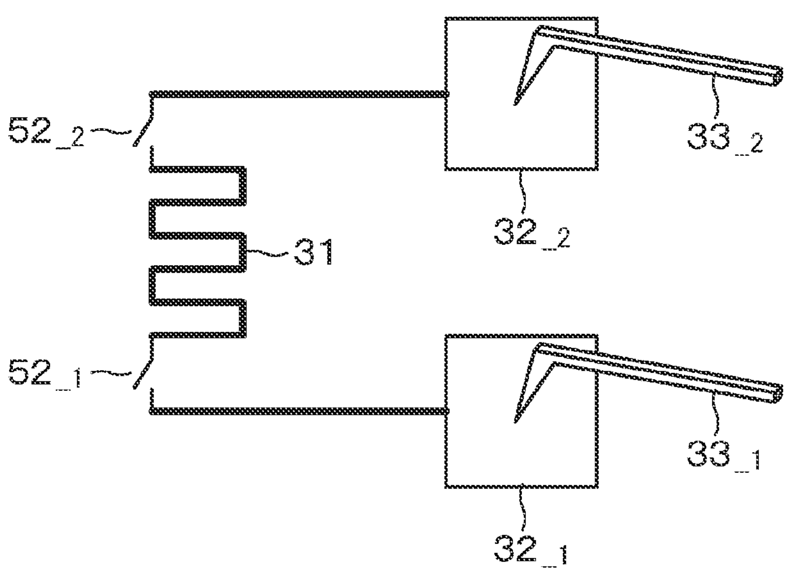
FIG. 13B is a diagram illustrating a pad electrode arrangement structure according to an application example (second application example).

The application example (second application example) illustrated in FIG. 13B is an example in which switch elements $\mathbf{52}_{1}$ and $\mathbf{52}_{2}$ are connected between the two pad electrodes $\mathbf{32}_{1}$ and $\mathbf{32}_{2}$ and the resistance element 31. The electrical connection between the resistance element 31 for temperature measurement and the two pad electrodes $\mathbf{32}_{1}$ and $\mathbf{32}_{2}$ can be disconnected using, for example, the switch elements $\mathbf{52}_{1}$ and $\mathbf{52}_{2}$ constituted as a CMOS switch. This makes it possible to eliminate the current passing between the two pad electrodes $\mathbf{32}_{1}$ and $\mathbf{32}_{2}$. Using the two pad electrodes $32_{1}$ and $32_{2}$ as a power supply or ground (GND) during normal driving then lowers the power supply impedance, leading to an improvement in the imaging characteristics of the CMOS image sensor 1.

Modification of First Embodiment

Hereinabove, the technology according to the present disclosure is described on the basis of preferred embodiments; however, the technology according to the present disclosure is not limited to the embodiments. The configurations and structures of the image capturing apparatus described in the above first embodiment are examples and may be altered as appropriate.

Figure 14:
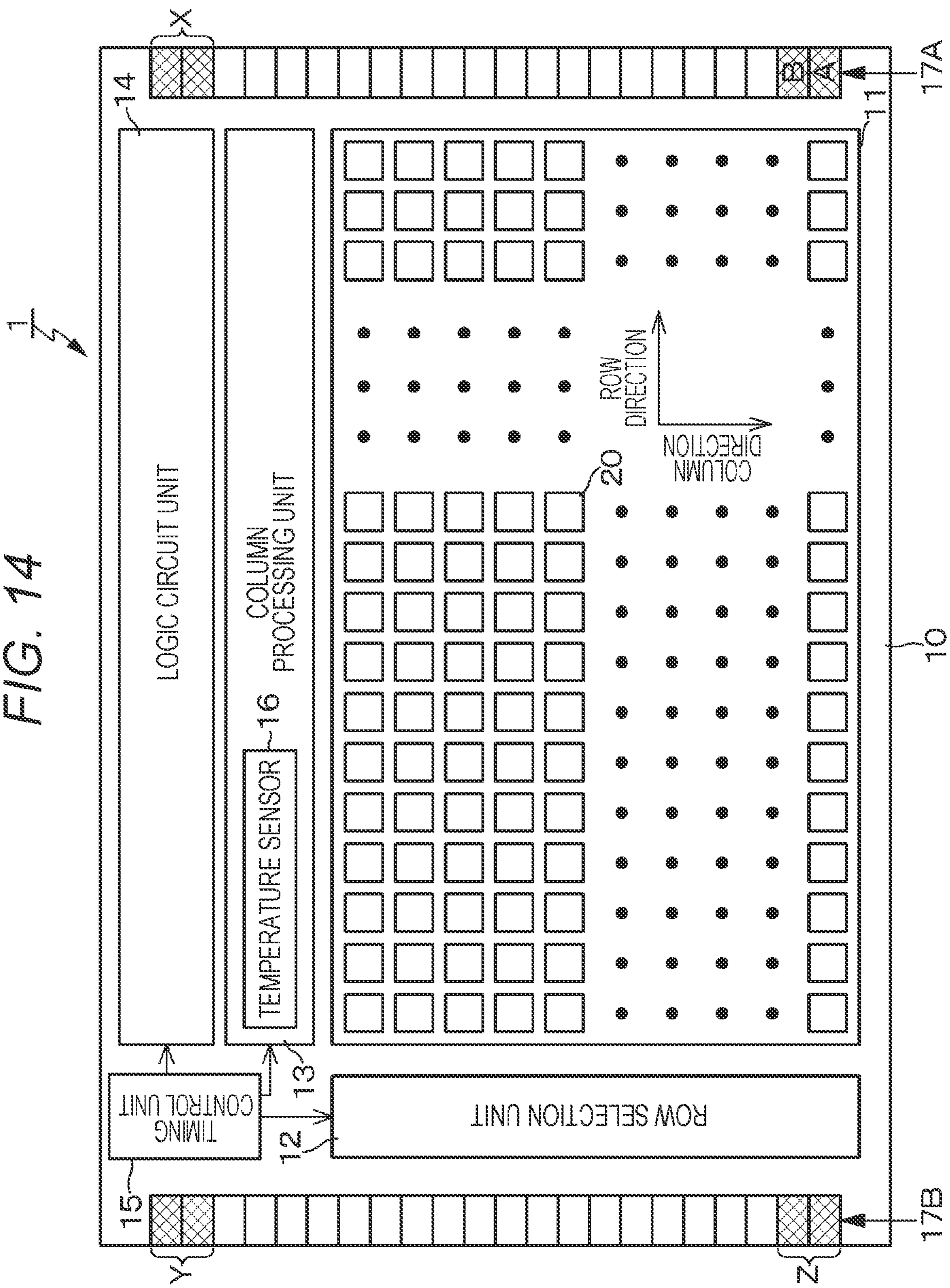
FIG. 14 is a diagram illustrating a pad electrode for temperature measurement in a different arrangement location.

In one example, the above-mentioned first embodiment uses the two pad electrodes A and B as the two pad electrodes $32_{1}$ and $32_{2}$ for temperature measurement connected with the resistance element 31. The two pad electrodes A and B are located in the lower end portion of the pad electrode group 17A of the pad electrode groups 17A and 17B. The number and location of the pad electrodes for temperature measurement are not limited to a particular number or location. In one example, as illustrated in FIG. 14, a pad electrode of an upper end portion X of the pad electrode group 17A can be used, or a pad electrode of an upper end portion Y or a lower end portion Z of the pad electrode group 17B can be used.

[Semiconductor Chip Structure of Stacked Structure]

Figure 15:
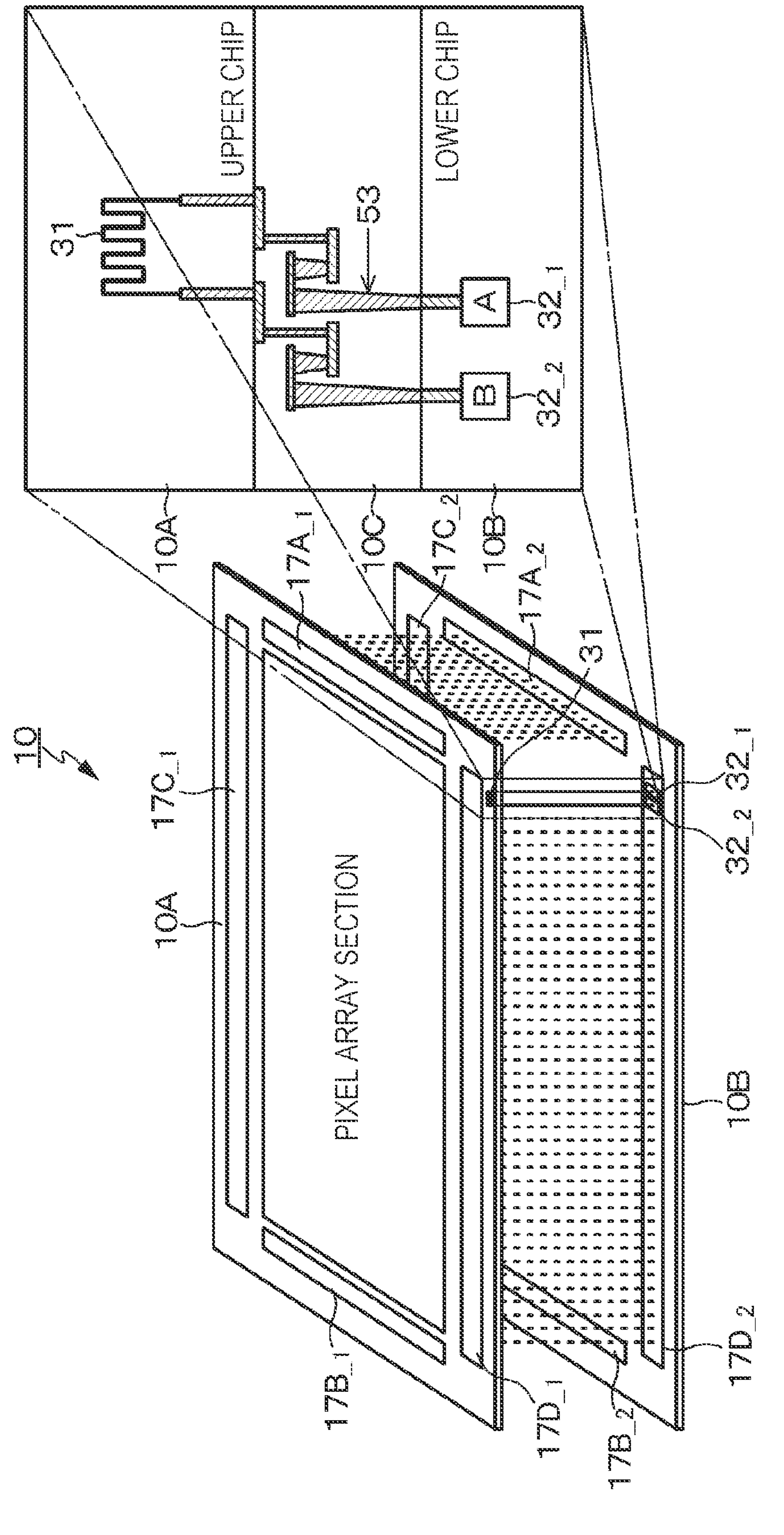
FIG. 15 is an exploded perspective view illustrating a semiconductor chip structure having a stacked structure.

The semiconductor chip structure of the CMOS image sensor 1 can be a flat plane structure or a stacked structure. The description is now given for a case where the semiconductor chip structure of the CMOS image sensor 1 has a stacked structure. FIG. 15 is an exploded perspective view illustrating a semiconductor chip structure having a stacked structure.

As illustrated in FIG. 15, the semiconductor chip 10 of the CMOS image sensor 1 has, for example, a stacked structure in which a first semiconductor chip 10A and a second semiconductor chip 10B are stacked. In FIG. 15, the first semiconductor chip 10A is used as an upper chip, and the second semiconductor chip 10B is used as a lower chip. The first semiconductor chip 10A has the pixel array section 11 formed thereon. The pixel array section 11 has the pixels 20 arranged in a matrix. The second semiconductor chip 10B has the peripheral circuit section of the pixel array section 11. The peripheral circuit section is formed on the second semiconductor chip 10B. The stacked structure of the two semiconductor chips of the first semiconductor chip 10A and the second semiconductor chip 10B is used in this example, but a stacked structure of three or more semiconductor chips is also possible.

Moreover, in this example, pad electrode groups 17C and 17D are also provided at both ends in the column direction, in addition to the pad electrode groups 17A and 17B being provided at both ends in the row direction of the semiconductor chip 10. The pad electrode group 17A includes a pad electrode group $17A_{1}$ on the upper chip side and a pad electrode group $17A_{2}$ on the lower chip side. The pad electrode group 17B includes a pad electrode group $17B_{1}$ on the upper chip side and a pad electrode group $17B_{2}$ on the lower chip side. Similarly, the pad electrode group 17C includes a pad electrode group $17C_{1}$ on the upper chip side and a pad electrode group $17C_{2}$ on the lower chip side. The pad electrode group 17D includes a pad electrode group $17D_{1}$ on the upper chip side and a pad electrode group $17D_{2}$ on the lower chip side.

In the above-mentioned stacked structure, the resistance element 31 for temperature measurement is provided on the first semiconductor chip 10A, which is the upper chip. The two pad electrodes $32_{1}$ and $32_{2}$ are provided on the second semiconductor chip 10B, which is the lower chip. Specifically, the two pad electrodes A and B at the ends of the pad electrode group $17D_{2}$ on the lower chip side are used as the two pad electrodes $32_{1}$ and $32_{2}$.

The resistance element 31 and the two pad electrodes $32_{1}$ and $32_{2}$ are then electrically connected by a connection portion 10C that electrically connects the first semiconductor chip 10A and the second semiconductor chip 10B. FIG. 15 illustrates a connection method using a through-chip via (TCV) 53 as the connection portion 10C for electrically connecting the resistance element 31 and the two pad electrodes $32_{1}$ and $32_{2}$. However, the connection method of the connection portion 10C illustrated in this example is illustrative, and the method is not limited to this example. Another preferable connection method can exemplify a metal-metal bonding including a Cu—Cu bond.

The semiconductor chip 10 has the stacked structure in which the first semiconductor chip 10A and the second semiconductor chip 10B are stacked as described above. In this semiconductor chip 10, the resistance element 31 provided on the first semiconductor chip 10A allows for measuring the temperature of the first semiconductor chip 10A having the pixel array section 11 formed thereon. This pixel array section 11 has the pixels 20 arranged in a matrix.

Second Embodiment

Figure 16:
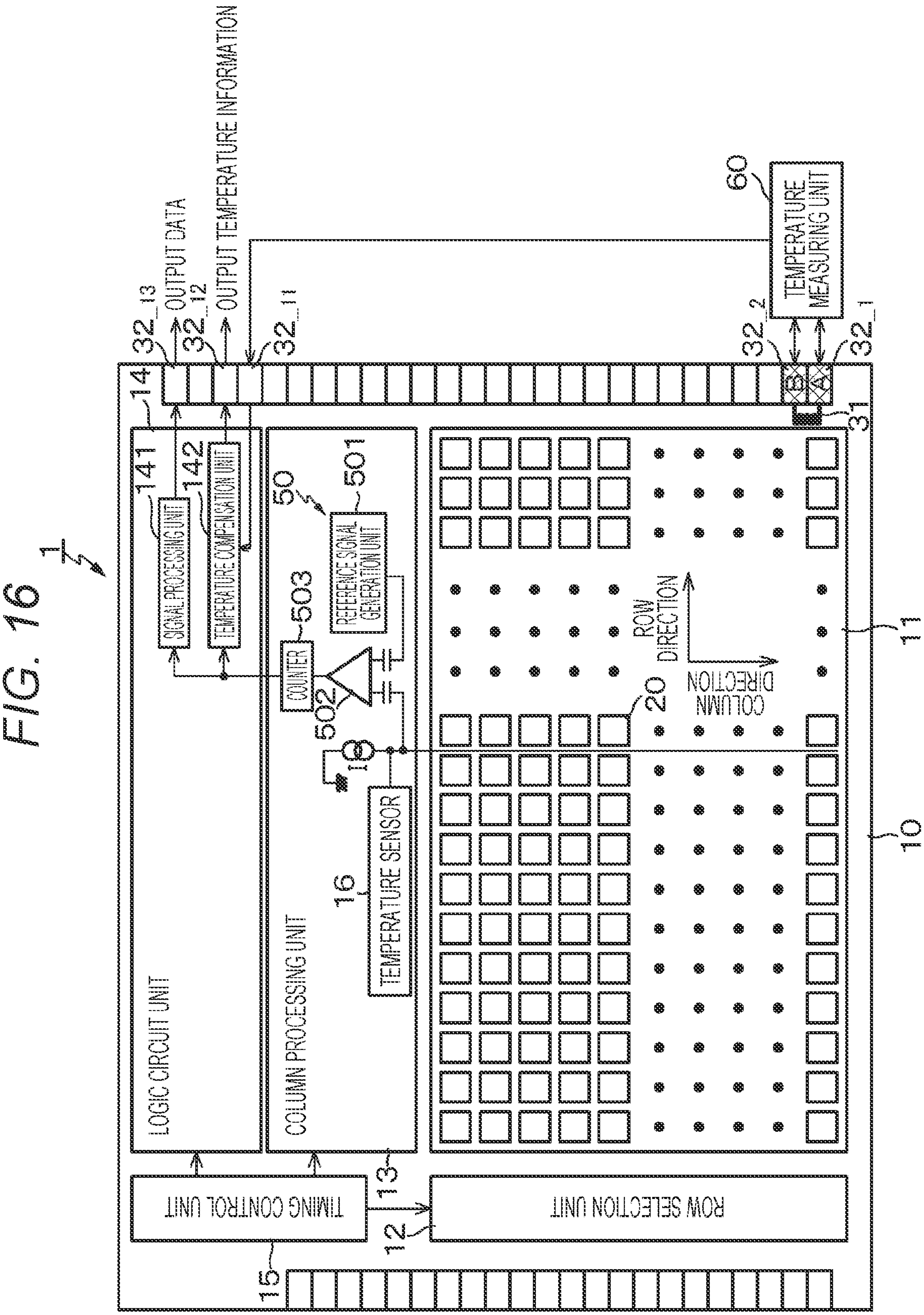
FIG. 16 is a system configuration diagram illustrating an example of the system configuration of a temperature compensation system according to a second embodiment of the present disclosure.

A temperature compensation system according to a second embodiment of the present disclosure is a system that compensates for the temperature sensed by the temperature sensor 16 equipped in the semiconductor chip 10 of the semiconductor apparatus according to the first embodiment having the configuration described above, that is, the CMOS image sensor 1. FIG. 16 illustrates an example of the system configuration of the temperature compensation system according to the second embodiment of the present disclosure.

The temperature compensation system according to the second embodiment of the present disclosure includes a temperature measuring unit 60 in addition to the CMOS image sensor 1 having the above-mentioned configuration in which the temperature sensor 16 is mounted on the semiconductor chip 10.

In the semiconductor chip 10, the temperature measuring unit 60 applies a certain electrical signal (certain voltage or current) between the pad electrodes $32_{1}$ and $32_{2}$ connected with the resistance element 31 to measure the current or voltage proportional to the actual temperature of the semiconductor chip 10, thus measuring the actual temperature of the semiconductor chip 10. In one example, the temperature measuring unit 60 calculates the actual temperature of the semiconductor chip 10 from the value of the current flowing through the resistance element 31 when the certain voltage is applied to the resistance element 31. Alternatively, the temperature measuring unit 60 calculates the actual temperature of the semiconductor chip 10 from the value of voltage across the resistance element 31 when the certain current flows through the resistance element 31.

In the CMOS image sensor 1, the temperature information sensed by the temperature sensor 16 is supplied to the logic circuit unit 14 via the analog-digital converter 50 provided in the column processing unit 13. Examples of the analog-digital converter 50 can include a single-slope analog-todigital converter that is one example of a reference signal comparison analog-to-digital converter, a sequential comparison analog-to-digital converter, a delta-sigma modulation (ΔΣ modulation) analog-digital converter, or the like.

This example illustrates a case where a single-slope analog-digital converter is used as the analog-to-digital converter 50. The single-slope analog-digital converter 50 includes, for example, a reference signal generation unit 501, a comparator 502, and a counter 503.

The reference signal generation unit 501 is constituted by, for example, a digital-to-analog conversion (DAC) circuit. The reference signal generation unit 501 generates so-called a ramp wave reference signal in which its level (voltage) decreases monotonically with time as a reference signal for analog-to-digital conversion.

The comparator 502 uses an analog pixel signal that is read from the pixel 20 as a comparison input and uses a reference signal that is generated by the reference signal generation unit 501 as a reference input, and compares both signals. Then, the comparator 502 has, for example, an output that becomes in the first state (e.g., high level) when the reference signal is larger than the pixel signal and that becomes in the second state (e.g., low level) when the reference signal is equal to or less than the pixel signal. This configuration allows the comparator 502 to output a pulse signal having a pulse width corresponding to the magnitude of the signal level of the pixel signal as a comparison result.

The counter 503 is supplied with a clock signal from the timing control unit 15 at the same timing as the supply start timing of the reference signal to the comparator 502. The counter 503 then performs its counting operation in synchronization with the clock signal to measure the period of the pulse width of the output pulse of the comparator 502, that is, the period from the start to the end of the comparison operation. The result (count value) counted by the comparator 502 becomes a digital value obtained by digitizing an analog pixel signal.

The temperature information sensed by the temperature sensor 16 is supplied for the logic circuit unit 14 via the single-slope analog-digital converter 50 having the configuration mentioned above. The logic circuit unit 14 includes a signal processing unit 141, a temperature compensation unit 142, and the like.

The signal processing unit 141 executes predetermined signal processing on the pixel signal read from each pixel 20 of the pixel array section 11 through the column processing unit 13 and outputs the resulting signal through a pad electrode $\mathbf{32}_{-13}$.

The temperature compensation unit 142 compensates for the temperature, which is sensed by the temperature sensor 16 and supplied through the single-slope type analog-digital converter 50, thus correcting fluctuations in the individual device. Upon such temperature compensation, individual temperature measurement for each semiconductor chip 10 and individual temperature compensation of the temperature sensor for each semiconductor chip 10 are necessary not to be affected due to the temperature fluctuations in the wafer surface.

Therefore, in the present temperature compensation system, the temperature measuring unit 60 applies a certain electrical signal (certain voltage or current) between the pad electrodes $\mathbf{32}_{-1}$ and $\mathbf{32}_{-2}$ connected with the resistance element 31 to measure the current or voltage proportional to the actual temperature of the semiconductor chip 10, thus measuring the actual temperature of the semiconductor chip 10. The temperature information of the semiconductor chip 10 measured by the temperature measuring unit 60 is supplied for the temperature compensation unit 142 through a pad electrode $\mathbf{32}_{-11}$.

The temperature compensation unit 142 compensates for the temperature sensed by the temperature sensor 16 on the basis of the temperature of the semiconductor chip 10 measured by the temperature measuring unit 60. The temperature information, which is sensed by the temperature sensor 16 and compensated for by the temperature compensation unit 142, is output to the outside of the semiconductor chip 10 through a pad electrode $\mathbf{32}_{-12}$.

In this way, the use of the impedance element (the resistance element 31 in this example) individually provided for each semiconductor chip 10 allows the actual temperature of each semiconductor chip 10 to be measured, also reflecting the measurement to the compensation of the temperature sensed by the temperature sensor 16. Thus, it is possible to individually compensate for the temperature measured by the temperature sensor 16 for each semiconductor chip 10 without being affected by the temperature fluctuations in the wafer surface.

Third Embodiment

Figure 17:
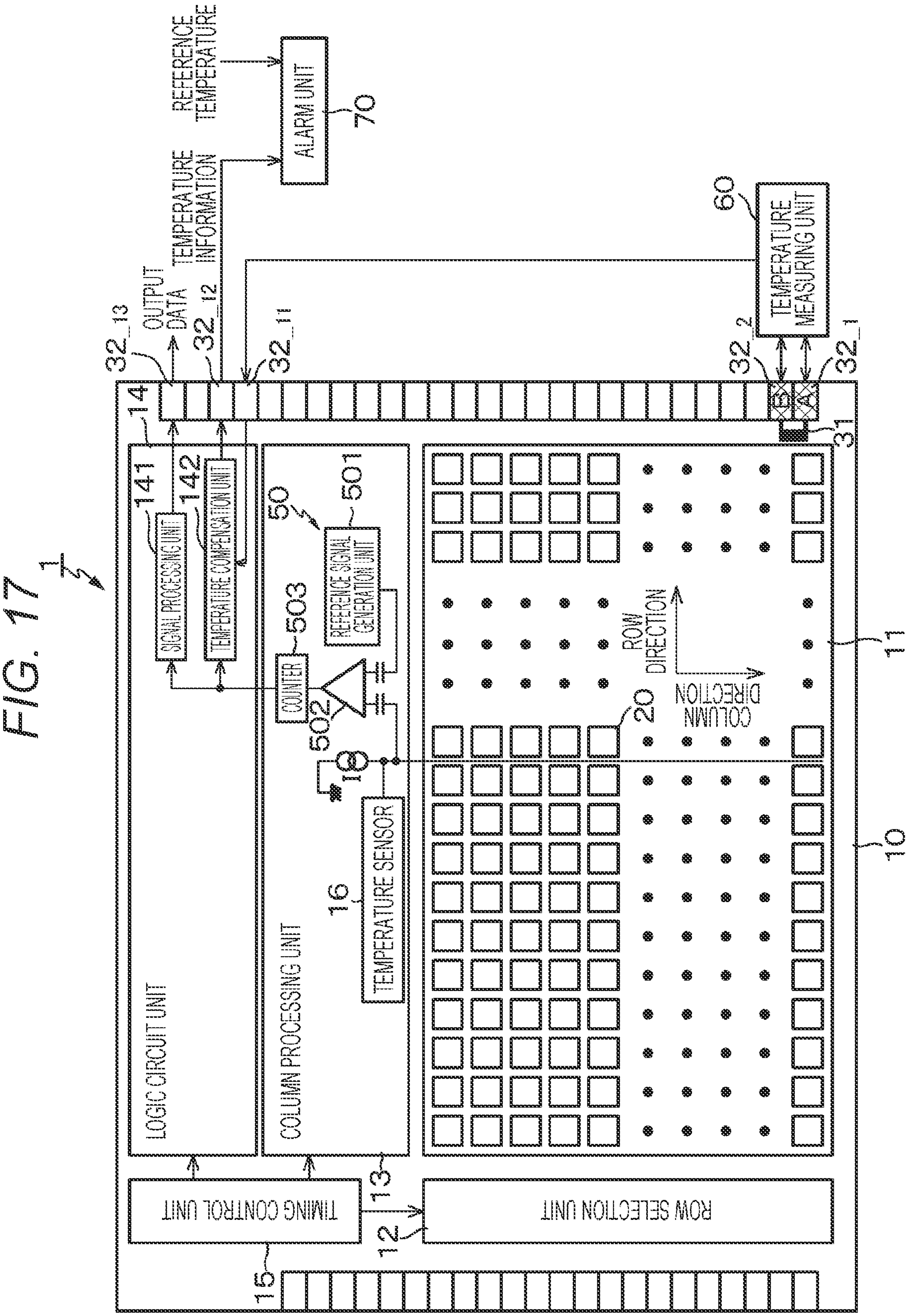
FIG. 17 is a system configuration diagram illustrating an example of the system configuration of an alarm system according to a third embodiment of the present disclosure.

The alarm system according to the third embodiment of the present disclosure is a system that issues an alarm upon detecting an abnormal temperature measured by the temperature sensor 16 equipped in the semiconductor chip 10 of the semiconductor apparatus according to the first embodiment having the configuration described above, that is, the CMOS image sensor 1. FIG. 17 is illustrating an example of the system configuration of an alarm system according to a third embodiment of the present disclosure.

The alarm system according to the third embodiment of the present disclosure includes the CMOS image sensor 1 provided with the temperature compensation system according to the second embodiment. The temperature compensation system according to the second embodiment has the configuration in which the temperature measuring unit 60 is equipped outside the semiconductor chip 10, and the temperature compensation unit 142 is equipped inside the semiconductor chip 10. In addition to such a CMOS image sensor, the alarm system includes an alarm unit 70 that detects whether the compensated temperature that is sensed by the temperature sensor 16 exceeds a predetermined reference temperature and, if so, issues an alarm.

The alarm unit 70 issues an alarm providing notification of the occurrence of the abnormality if the temperature sensed by the temperature sensor 16 equipped in the semiconductor chip 10 indicates an abnormal temperature. In one example, the alarm unit 70 issues the alarm in the case of detecting that the temperature information, which is sensed by the temperature sensor 16, compensated for by the temperature compensation unit 142, and output through a pad electrode $\mathbf{32}_{-12}$, exceeds a predetermined reference temperature (e.g., the upper limit temperature of the system). Examples of a method of issuing an alarm can include a visual way (alarm display using a display), an auditory way (alarm sound), or a way using a combination of both.

As described above, in the CMOS image sensor 1 that includes the temperature sensor 16 equipped in the semiconductor chip 10, an alarm to be issued when the temperature sensed by the temperature sensor 16 is abnormal allows rapid response to abnormal occurrences. An example of such a response is stopping the operation of the system. This configuration makes it possible to protect the circuit elements and the like on the semiconductor chip 10 from thermal destruction or the like due to temperatures. In addition, it is possible to detect an abnormality in the temperature sensor 16 itself. Moreover, the temperature measuring unit 60 outside the semiconductor chip 10 is used for correcting the value sensed by the temperature sensor 16 in the individual adjustment before shipping the semiconductor chip 10.

Application Example of Technology According to Present Disclosure

The technology according to the present disclosure (present technology) can be applied to various products. For example, the technology according to the present disclosure may be realized as an image capturing apparatus mounted on any type of mobile body such as an automobile, an electric vehicle, a hybrid electric vehicle, a motorcycle, a bicycle, a personal mobility, an airplane, a drone, a ship, a robot, a construction machine, and an agricultural machine (tractor).

Application Example to Mobile Bodies

Figure 18:
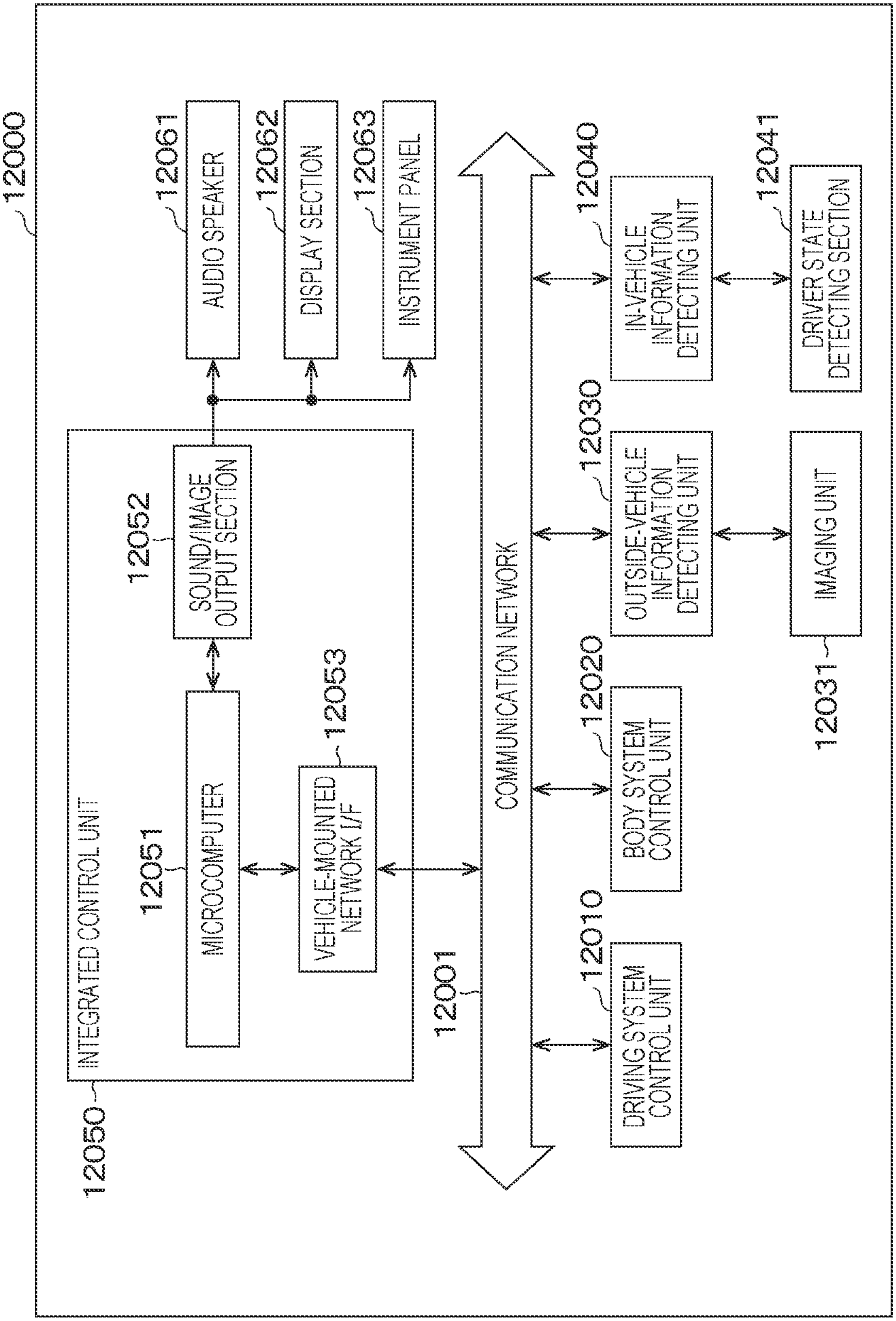
FIG. 18 is a block diagram showing an example of schematic configuration of a vehicle control system as an example of a mobile body control system to which the technology according to the present disclosure can be applied.

FIG. 18 is a block diagram showing an example of schematic configuration of a vehicle control system as an example of a mobile body control system to which the technology according to the present disclosure can be applied.

The vehicle control system 12000 includes a plurality of electronic control units connected to each other via a communication network 12001. In the example illustrated in FIG. 1021, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging unit 12031 is an optical sensor that receives light, and which outputs an electrical signal corresponding to a received light amount of the light. The imaging unit 12031 can output the electrical signal as an image, or can output the electrical signal as information about a measured distance. In addition, the light received by the imaging unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 18, an audio speaker 12061, a display section 12062, and an instrument panel 12063 are illustrated as the output device. The display section 12062 may, for example, include at least one of an on-board display or a head-up display.

Figure 19:
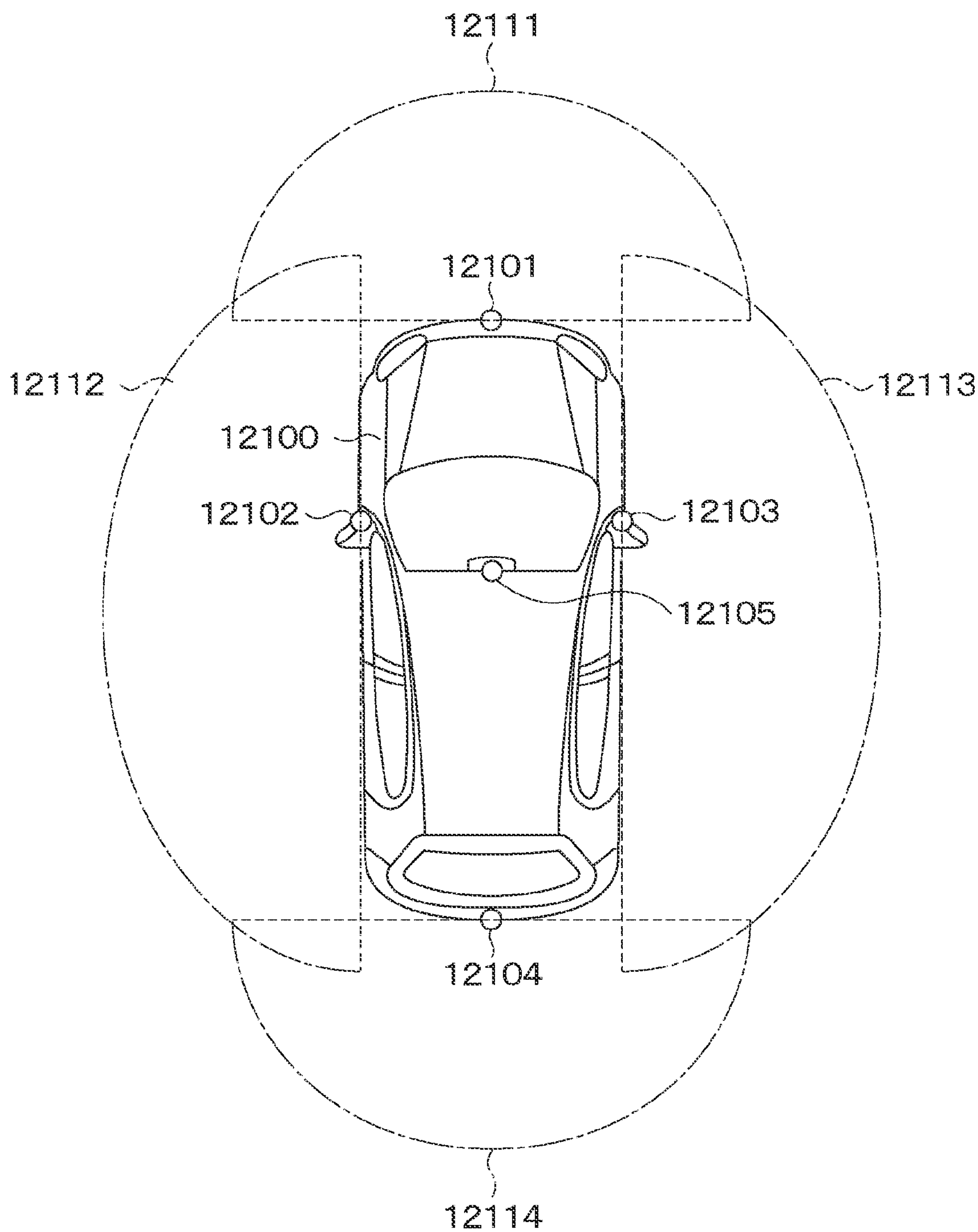
FIG. 19 is a view illustrating an example of an installation position of the image capturing apparatus in the moving body control system.

FIG. 19 is a diagram showing an example of the installation position of the imaging unit 12031.

In FIG. 19, the vehicle 12100 includes imaging units 12101, 12102, 12103, 12104, and 12105 as the imaging unit 12031.

The imaging units 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle, and the like. The imaging unit 12101 provided to the front nose and the imaging unit 12105 provided to the upper portion of the windshield within the interior of the vehicle obtain mainly an image of the front of the vehicle 12100. The imaging units 12102 and 12103 provided to the sideview mirrors obtain mainly an image of the sides of the vehicle 12100. The imaging unit 12104 provided to the rear bumper or the back door obtains mainly an image of the rear of the vehicle 12100. An image of the front obtained by the imaging units 12101 and 12105 is used mainly to detect a preceding vehicle, a pedestrian, an obstacle, a signal, a traffic sign, a lane, or the like.

Incidentally, FIG. 19 illustrates an example of imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the sideview mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Furthermore, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs an alarm to the driver via the audio speaker 12061 or the display section 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in captured images of the imaging units 12101 to 12104. Such recognition of a pedestrian is, for example, performed by a procedure of extracting characteristic points in the captured images of the imaging units 12101 to 12104 as infrared cameras and a procedure of determining whether or not it is the pedestrian by performing pattern matching processing on a series of characteristic points representing the contour of the object. When the microcomputer 12051 determines that there is a pedestrian in the captured images of the imaging units 12101 to 12104, and thus recognizes the pedestrian, the sound/image output section 12052 controls the display section 12062 so that a square contour line for emphasis is displayed so as to be superimposed on the recognized pedestrian. Furthermore, the sound/image output section 12052 may also control the display section 12062 so that an icon or the like representing the pedestrian is displayed at a desired position.

Hereinabove, an example of a vehicle control system to which the technology according to the present disclosure can be applied is described. In the technology according to the present disclosure, for example, the CMOS image sensor according to the first embodiment in which the temperature sensor 16 is mounted on the semiconductor chip 10 can be used as the imaging unit 12031 among the configurations described above.

A CMOS image sensor mounted on a vehicle includes, as safety performance, a temperature sensor 16 inside a device in order to stop a function when a system reaches an upper limit temperature. In particular, in a high temperature range, the temperature sensor 16 is required to have high measurement accuracy of ±1 degree. Therefore, by providing the temperature compensation system according to the second embodiment, high measurement accuracy of the temperature sensor 16 can be maintained. Furthermore, by providing the alarm according to the third embodiment, it is possible to issue an alarm for maintaining safety performance when an abnormality such as the system reaching the upper limit temperature occurs.

<Configuration that can be Taken by the Present Disclosure>

Note that the present disclosure may have the following configurations.

<<A. Semiconductor Apparatus>>

[A-1] A semiconductor apparatus including:

a semiconductor chip;

a plurality of pad electrodes formed in the semiconductor chip; and an impedance element electrically connected between at least two pad electrodes of the plurality of pad electrodes, in which the semiconductor apparatus is configured to be capable of measuring a temperature of the semiconductor chip by applying a certain electrical signal between the at least two pad electrodes connected with the impedance element from outside of the semiconductor chip.

[A-2] The semiconductor apparatus according to [A-1], in which the impedance element is a temperature-dependent element.

[A-3] The semiconductor apparatus according to [A-2], in which the impedance element is a resistance element.

[A-4] The semiconductor apparatus according to any one of [A-1] to [A-3], in which the semiconductor chip is equipped with a temperature sensor that measures a temperature inside a device.

[A-5] The semiconductor apparatus according to any one of [A-1] to [A-4], in which the size of the at least two pad electrodes connected with the impedance element is larger than the size of another pad electrode.

[A-6] The semiconductor apparatus according to any one of [A-1] to [A-4], in which the size of the at least two pad electrodes connected with the impedance element is smaller than the size of another pad electrode.

[A-7] The semiconductor apparatus according to any one of [A-1] to [A-4], in which the at least two pad electrodes connected with the impedance element are provided such that another pad electrode is sandwiched between the at least two pad electrodes.

[A-8] The semiconductor apparatus according to any one of [A-1] to [A-4], in which the at least two pad electrodes connected with the impedance element each include multiple pad electrodes that are electrically connected to each other.

[A-9] The semiconductor apparatus according to any one of [A-1] to [A-4], in which the pad electrodes connected with the impedance element are three or more pad electrodes, and the number of the pad electrodes connected with the impedance element is three or more, and a wiring that electrically connects the three or more pad electrodes and the impedance element is a wiring that has the conductor length, conductor material, wire diameter, and electrical resistance that are equal.

[A-10] The semiconductor apparatus according to any one of [A-1] to [A-9], in which the semiconductor apparatus is an image capturing apparatus with a stacked structure semiconductor chip in which a first semiconductor chip and a second semiconductor chip are stacked and electrically connected to each other, a pixel array section in which a pixel is arranged is formed on the first semiconductor chip, a peripheral circuit section of the pixel array section is formed on the second semiconductor chip, the impedance element is provided in the first semiconductor chip, and the at least two pad electrodes connected with the impedance element are provided in the second semiconductor chip.

<<B. Temperature Compensation System>>

[B-1] A temperature compensation system including:

a semiconductor apparatus having a semiconductor chip equipped with a temperature sensor;

a temperature measuring unit that measures a temperature of the semiconductor chip; and a temperature compensation unit that compensates for a temperature sensed by the temperature sensor, in which the semiconductor apparatus has a plurality of pad electrodes formed in the semiconductor chip and an impedance element electrically connected between at least two pad electrodes among the plurality of pad electrodes, the temperature measuring unit measures the temperature of the semiconductor chip by applying a certain electrical signal between the at least two pad electrodes connected with the impedance element from outside of the semiconductor chip, and the temperature compensation unit compensates for the temperature sensed by the temperature sensor on the basis of the temperature of the semiconductor chip measured by the temperature measuring unit.

[B-2] The temperature compensation system according to [B-1], in which the impedance element is a temperature-dependent element.

[B-3] The temperature compensation system according to [B-2], in which the impedance element is a resistance element.

[B-4] The temperature compensation system according to [B-3], in which the temperature measuring unit applies a certain voltage to the resistance element and calculates the temperature of the semiconductor chip from a value of current flowing through the resistance element.

[B-5] The temperature compensation system according to [B-3], in which the temperature measuring unit causes a certain current to flow through the resistance element and calculates the temperature of the semiconductor chip from a value of voltage across the resistance element.

<<C. Alarm System>>

[C-1] An alarm system including:

a semiconductor apparatus having a semiconductor chip equipped with a temperature sensor;

a temperature measuring unit that measures a temperature of the semiconductor chip;

a temperature compensation unit that compensates for a temperature sensed by the temperature sensor; and an alarm unit, in which the semiconductor apparatus has a plurality of pad electrodes formed in the semiconductor chip and an impedance element electrically connected between at least two pad electrodes among the plurality of pad electrodes, the temperature measuring unit measures the temperature of the semiconductor chip by applying a certain electrical signal between the at least two pad electrodes connected with the impedance element from outside of the semiconductor chip, the temperature compensation unit compensates for the temperature sensed by the temperature sensor on the basis of the temperature of the semiconductor chip measured by the temperature measuring unit, and the alarm unit issues an alarm upon detecting that the temperature compensated for by the temperature compensation unit exceeds a predetermined reference temperature.

[C-2] The alarm system according to [C-1], in which the impedance element is a temperature-dependent element.

[C-3] The alarm system according to [C-2], in which the impedance element is a resistance element.

[C-4] The alarm system according to [C-3], in which the impedance element is a resistance element.

[C-5] The alarm system according to [C-4], in which the temperature measuring unit applies a certain voltage to the resistance element and calculates the temperature of the semiconductor chip from a value of current flowing through the resistance element.

[C-6] The alarm system according to [C-4], in which the temperature measuring unit causes a certain current to flow through the resistance element and calculates the temperature of the semiconductor chip from a value of voltage across the resistance element.

REFERENCE SIGNS LIST

1 CMOS image sensor
10 Semiconductor chip (semiconductor substrate)
11 Pixel array section
12 Row selection unit
13 Column processing unit
14 Logic circuit unit
15 Timing control unit
16 Temperature sensor
20 Pixel
21 Photodiode
22 Transfer transistor
23 Reset transistor
24 Amplification transistor
25 Selection transistor
31 Resistance element
32$_{-1}$ to 32$_{-6}$ Pad electrode
33(33$_{-1}$, 33$_{-2}$) Probe needle
50 Analog-digital converter
60 Temperature measuring unit
70 Alarm unit

The invention claimed is:

1. A semiconductor apparatus comprising:

a semiconductor chip;

a pixel array section including a plurality of pixels;

a plurality of pad electrodes formed in the semiconductor chip;

an impedance element configured as a temperature-dependent element and disposed such that the impedance element is electrically connected between two pad electrodes of the plurality of pad electrodes, wherein the two pad electrodes are measurement terminals for the impedance element; and a temperature sensor that measures a temperature inside a device, the temperature sensor being located in a peripheral circuit section of the pixel array section, wherein the semiconductor apparatus is configured to measure a temperature of the semiconductor chip by externally applying an electrical signal between the two pad electrodes connected with the impedance element, the electrical signal being applied from outside of the semiconductor chip to the two pad electrodes, wherein the electrical signal is applied from outside of the semiconductor chip by an external measurement instrument to the two pad electrodes.

2. The semiconductor apparatus according to claim 1, wherein the impedance element is a resistance element.

3. The semiconductor apparatus according to claim 1, wherein the size of the two pad electrodes connected with the impedance element is larger than the size of another pad electrode.

4. The semiconductor apparatus according to claim 1, wherein the size of the two pad electrodes connected with the impedance element is smaller than the size of another pad electrode.

5. The semiconductor apparatus according to claim 1, wherein the two pad electrodes connected with the impedance element are provided such that another pad electrode is sandwiched between the two pad electrodes.

6. The semiconductor apparatus according to claim 1, wherein the two pad electrodes connected with the impedance element each include multiple pad electrodes that are adjacent and electrically connected to each other.

7. The semiconductor apparatus according to claim 1, wherein the pad electrodes connected with the impedance element are three or more pad electrodes, and the number of the pad electrodes connected with the impedance element is three or more, and a wiring that electrically connects the three or more pad electrodes and the impedance element is a wiring that has a conductor length, conductor material, wire diameter, and electrical resistance that are equal.

8. The semiconductor apparatus according to claim 1, wherein the semiconductor apparatus is an image capturing apparatus, the semiconductor chip is a stacked structure semiconductor chip in which a first semiconductor chip and a second semiconductor chip are stacked and electrically connected to each other, the pixel array section is formed on the first semiconductor chip, the peripheral circuit section is formed on the second semiconductor chip, the impedance element is provided in the first semiconductor chip, and the two pad electrodes connected with the impedance element are provided in the second semiconductor chip.

9. The semiconductor apparatus according to claim 1, wherein the external measurement instrument is configured to apply the electrical signal for measuring an electrical parameter of the impedance element corresponding to temperature.

10. The semiconductor apparatus according to claim 1, wherein the temperature of the semiconductor chip is determined based on an impedance measured between the two pad electrodes by the external measurement instrument.

11. A temperature compensation system comprising the semiconductor apparatus according to claim 1.

12. The temperature compensation system according to claim 11, wherein the impedance element is a resistance element.

13. The temperature compensation system according to claim 11, wherein the semiconductor apparatus is an image capturing apparatus, the semiconductor chip is a stacked structure semiconductor chip in which a first semiconductor chip and a second semiconductor chip are stacked and electrically connected to each other, the pixel array section is formed on the first semiconductor chip, the peripheral circuit section is formed on the second semiconductor chip, the impedance element is provided in the first semiconductor chip, and the two pad electrodes connected with the impedance element are provided in the second semiconductor chip.

14. An alarm system comprising the semiconductor apparatus according to claim 1.

15. The alarm system according to claim 14, wherein the impedance element is a resistance element.

16. The alarm system according to claim 14, wherein the semiconductor apparatus is an image capturing apparatus, the semiconductor chip is a stacked structure semiconductor chip in which a first semiconductor chip and a second semiconductor chip are stacked and electrically connected to each other, the pixel array section is formed on the first semiconductor chip, the peripheral circuit section is formed on the second semiconductor chip, the impedance element is provided in the first semiconductor chip, and the two pad electrodes connected with the impedance element are provided in the second semiconductor chip.

* * * * *